United States Patent
Keller et al.

(10) Patent No.: US 6,212,672 B1
(45) Date of Patent: *Apr. 3, 2001

(54) SOFTWARE DEVELOPMENT SYSTEM WITH AN EXECUTABLE WORKING MODEL IN AN INTERPRETABLE INTERMEDIATE MODELING LANGUAGE

(75) Inventors: Steven Keller, Hampstead, NH (US); Richard Gorzela, Lawrence, MA (US); Daniel Strom, North Andover, MA (US); David Hughes, Arlington, MA (US); James Holt, Needham, MA (US)

(73) Assignee: Dynamics Research Corporation, Wilmington, MA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/813,487

(22) Filed: Mar. 7, 1997

(51) Int. Cl.$^7$ ............................................. G06F 9/44
(52) U.S. Cl. ........................................................... 717/1
(58) Field of Search ..................................... 395/701, 702, 395/703, 704, 705, 706, 707, 708, 712; 717/1, 2

(56) References Cited

U.S. PATENT DOCUMENTS

| | | | |
|---|---|---|---|
| 5,487,141 | 1/1996 | Cain et al. ............................ | 395/135 |
| 5,537,630 | 7/1996 | Berry et al. .......................... | 395/155 |
| 5,720,018 | * 2/1998 | Muller et al. ........................ | 395/702 |
| 5,742,828 | * 4/1998 | Canady et al. ....................... | 395/702 |
| 5,764,241 | * 6/1998 | Elliot et al. .......................... | 395/702 |

OTHER PUBLICATIONS

Compilers Principles, Techniques and Tools Aho et al. Chapter 8 Intermediate Code Generation, pp. 463–465, Sep. 1985.*
Teach Yourself Visual Basic for Applications in 21 Days, pp. 28–36, Dec. 1994.*
Object–Oriented Modeling and Design, James Rumbaugh et al. pp. 57–62, Nov. 14, 1990.*
Template Software Inc. "User's Guide to the SNAP Development Environment" version 7.0, 1995.*
Template Softweare Inc. "User's Guide to the Development Process" version 7.0, 1995.*
Template Software, "Using the SNAP Development Environment" SNAP Foundation Environment Chpts 1–3, 1998.*
"Template Software Strenthens . . . ", Newswire, Product release information for version 8.0, 1998.*

(List continued on next page.)

*Primary Examiner*—Mark R. Powell
*Assistant Examiner*—Todd Ingberg
(74) *Attorney, Agent, or Firm*—Weingarten, Schurgin, Gagnebin & Hayes LLP

(57) ABSTRACT

A software development tool utilizes an intermediate object modeling language. The structure of the desired program is first described graphically by generating rule diagrams, state diagrams, and object diagrams such as user interface diagrams, event diagrams and other object diagrams. The development tool employs the diagrams to generate a working model of the program expressed in the object modeling language. The working model of the program can be executed without lengthy compiling, and hence program behavior can be quickly observed and tested. Further, the behavior of the working model can be quickly and easily changed by modifying the diagrams until the desired result is achieved. Source code is then generated from the object modeling language and compiled to create the final program.

92 Claims, 36 Drawing Sheets

OTHER PUBLICATIONS

Template Software Product release version 6.0, Sep. 1994.*
"Principles of Object–Oriented Analysis and Design" James Martin Text Book, Oct. 1992.*
Visual Object Oriented Programming Concepts and Enviroments: M. Burnett et al Text Book, Dec. 1994.*
Windows Tech Journal "The Seet Smell of C++" K Weeks, Sep. 1994.*

Computer Language "Smelling Like a Rose" Tom Bragg, Mar. 1993.*
Data Based Advisor "A Rose is a Rose" D. Goddard, Mar. 1995.*
Rational Software Corporation—Using Rational Rose C++ version 4.0, 1996.*

* cited by examiner

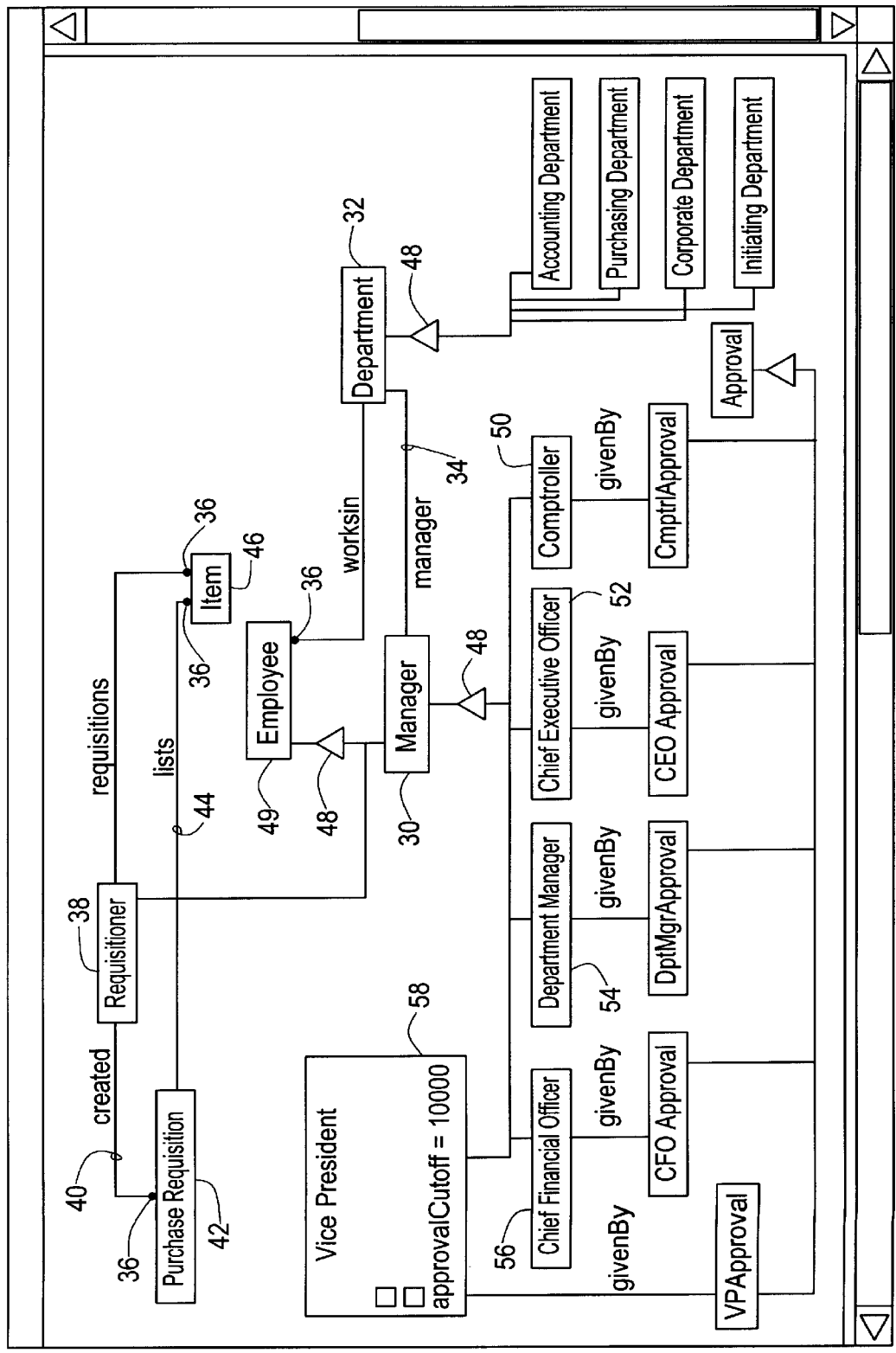
FIG. 2  An Object Diagram

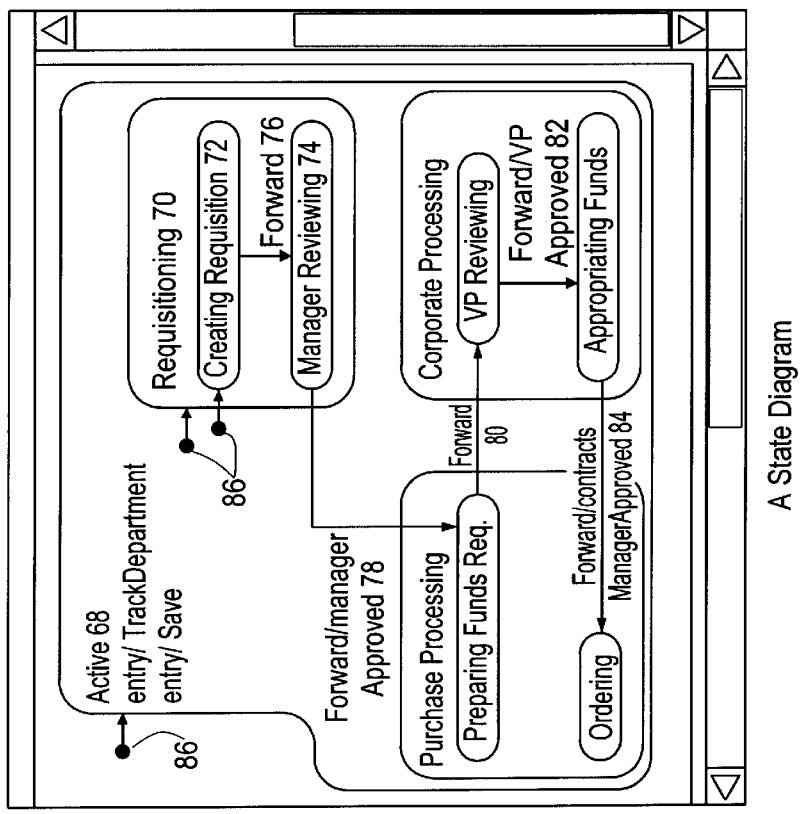
*FIG. 5*
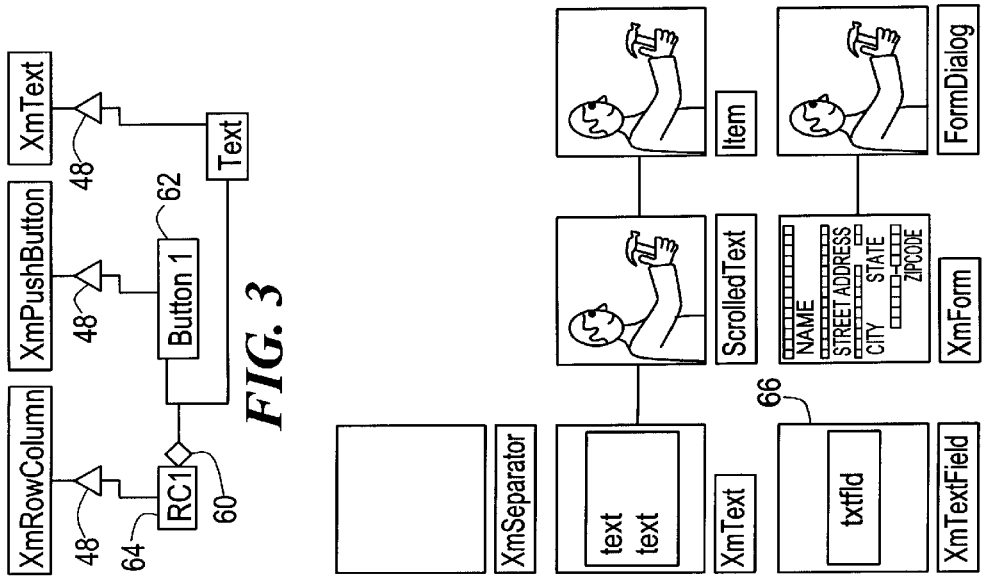
*FIG. 3*
*FIG. 4*

An Event Diagram

A RULE DIAGRAM

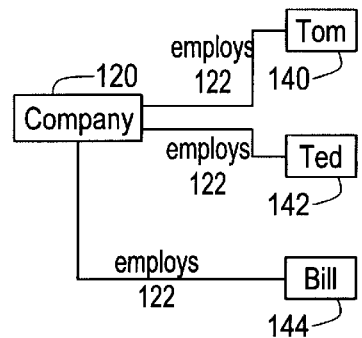
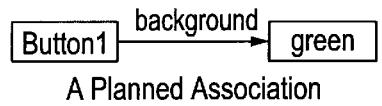
A Planned Association
*FIG. 15*
*FIG. 14*
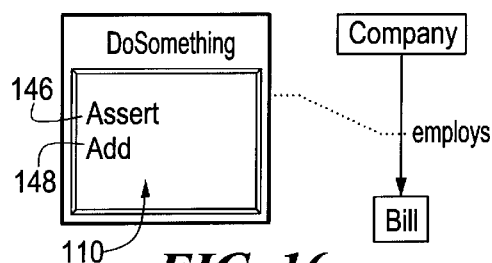
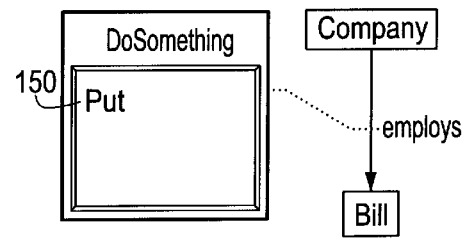
*FIG. 16*
*FIG. 17*
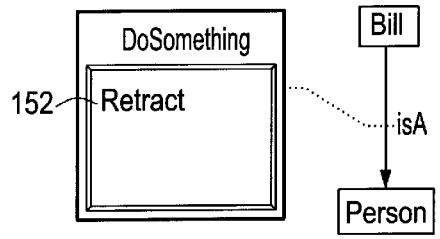
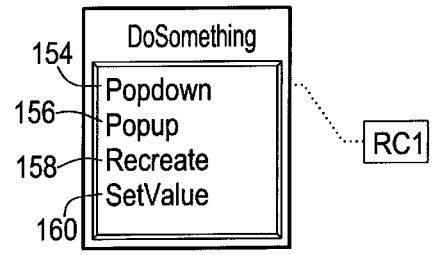
*FIG. 18*
*FIG. 19*
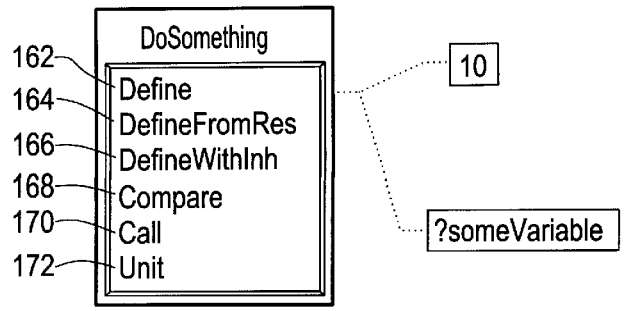
*FIG. 20*

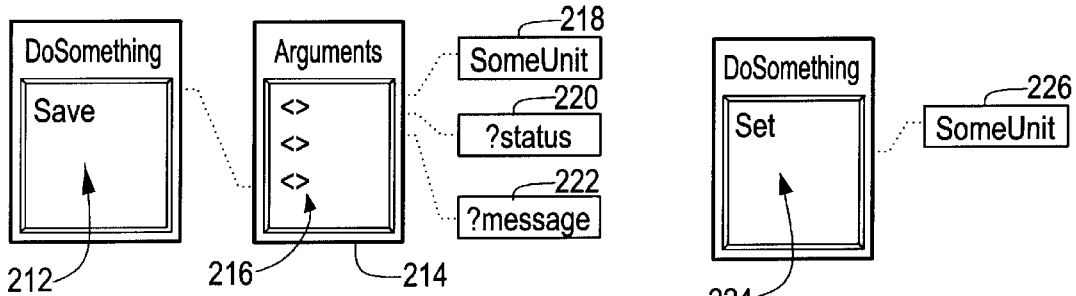
FIG. 24
FIG. 25
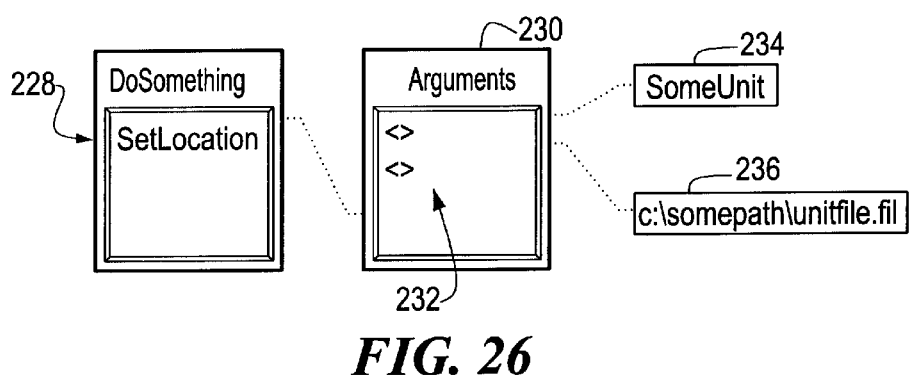
FIG. 26
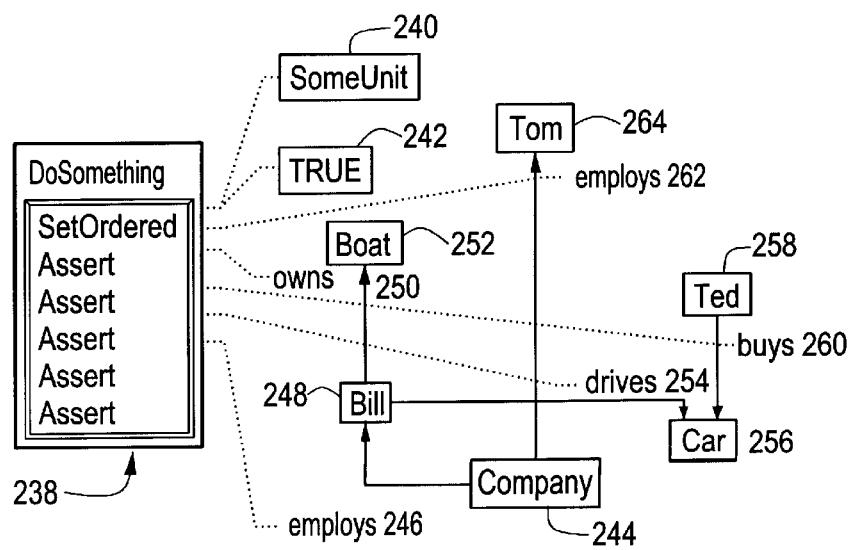
FIG. 27

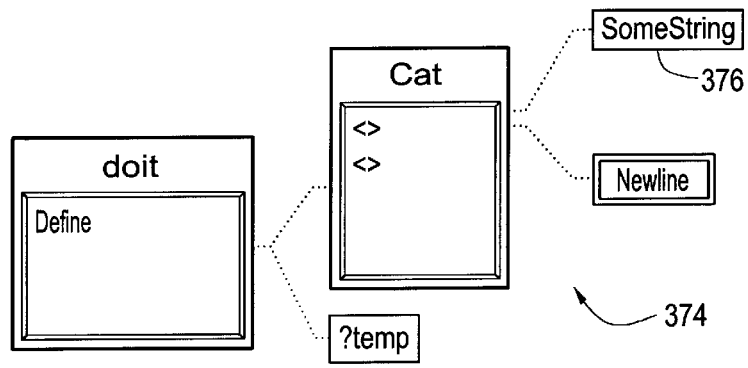
FIG. 44
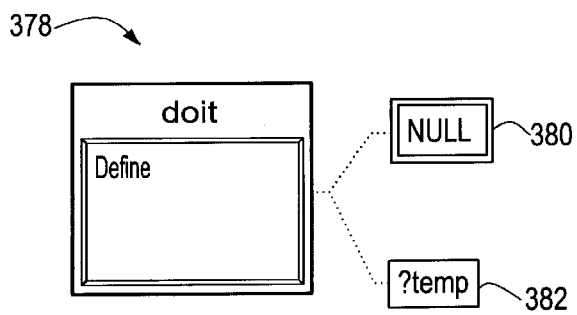
FIG. 45
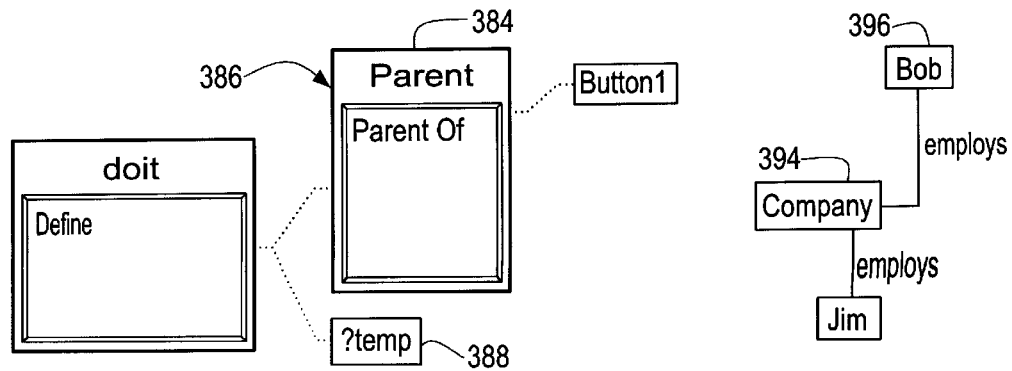
FIG. 46
FIG. 47

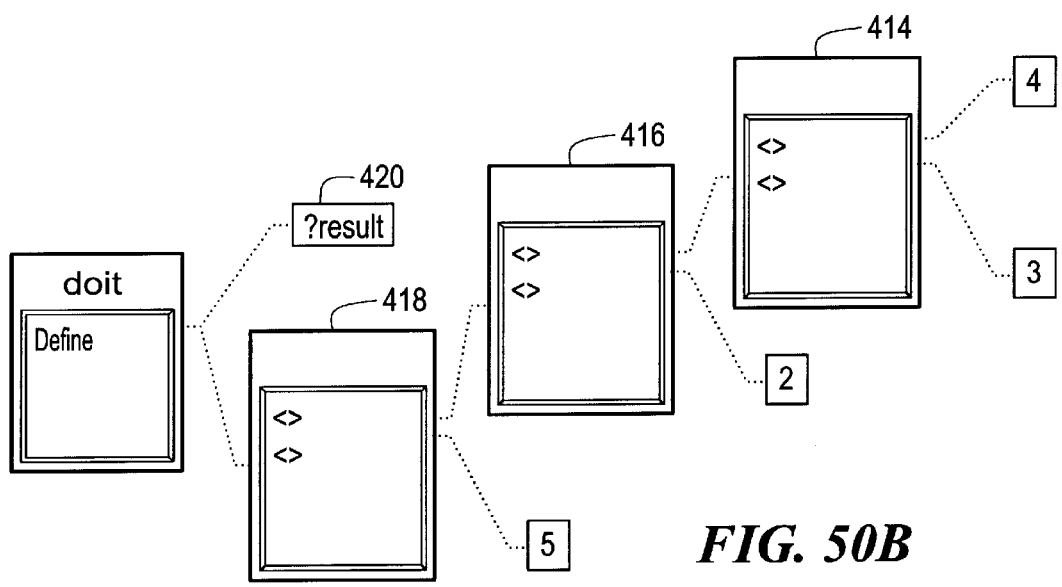
*FIG. 50B*
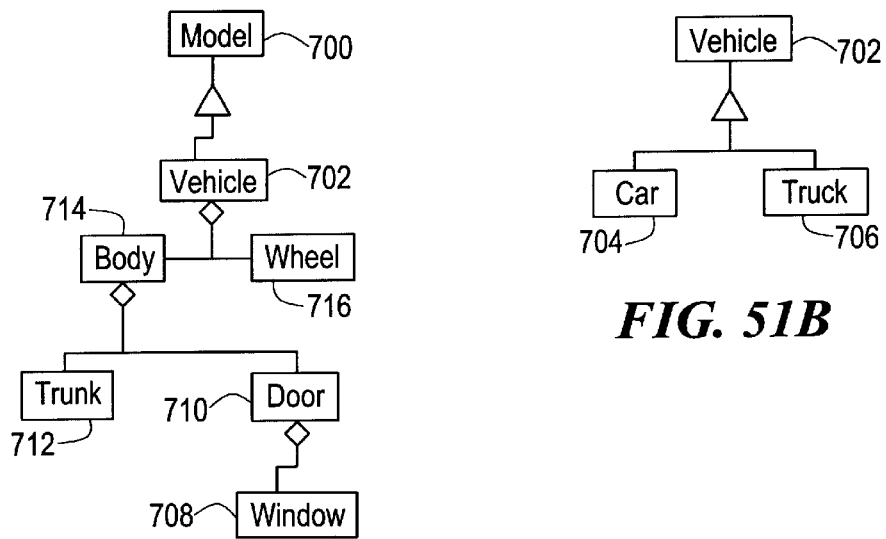
*FIG. 51A*
*FIG. 51B*

Translating Diagrams To OML Models

Owns (Bank,CashierStation)
Owns (Bank,Building)

isA (Station1,CashierStation)
isA (Station2,CashierStation)

Supervises (Supervisor,Employee)
Supervises (Fido,Buttons)
isA (Fido,Dog)
isA (Buttons,Cat)

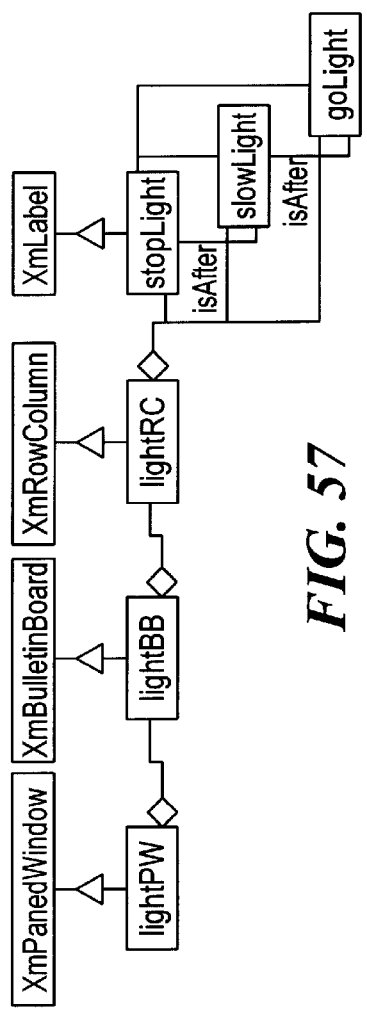
FIG. 57
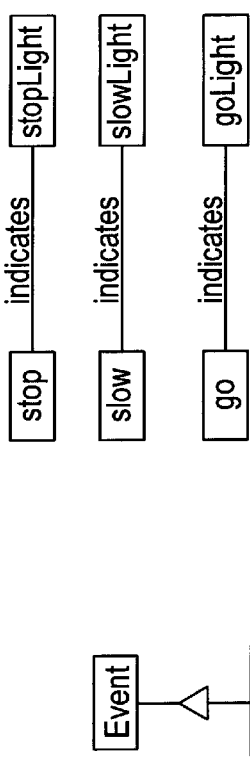
FIG. 59
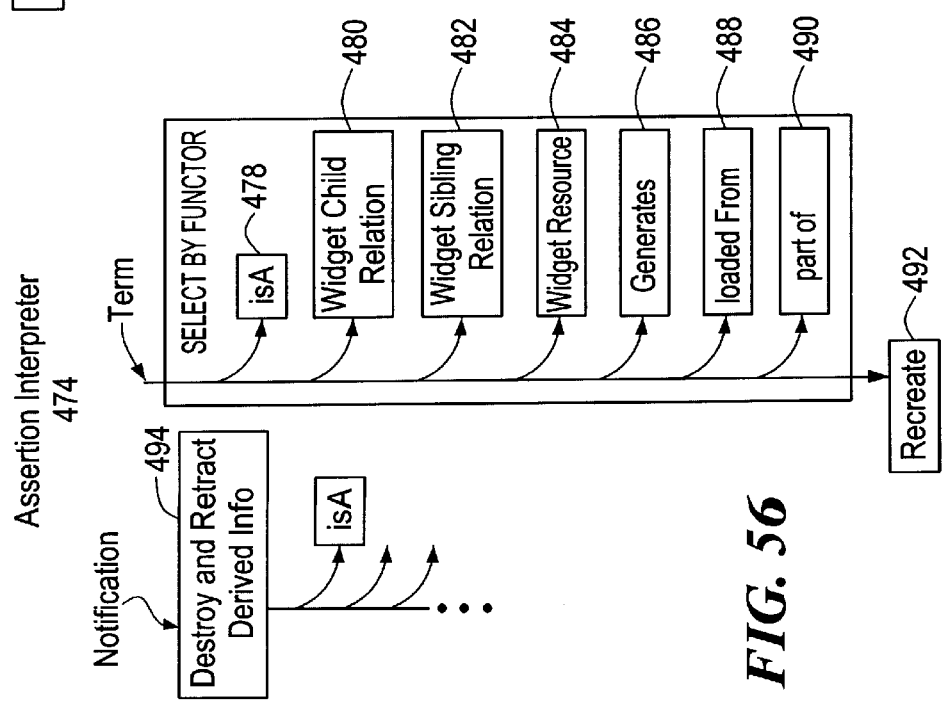
FIG. 58
FIG. 56

FIG. 63A isA(stopLightRC,AppUnit)
isA(stopLightRC,Object)
isA(stopLightRC,InterpretiveObject)
definedIn(stopLightRC,stopLightInterface)
isA(stopLightRC,XmRowColumn)
hasIsA(stopLightRC,stopLightInterface,XmRowColumn)
isPartOf(stopLightRC,stopLightBB)
isIn(stopLightRC,stopLightBB)
viMLastIsInDrawing(stopLightRC,stopLightInterface)
definedIn(stopLightRC,stopLightStates)
traceSD(stopLightRC,TRUE)
traceColor(stopLightRC,blue)
initialStateOfObject(stopLightRC,Active)
hasStatesOf(stopLightRC,stopLightStates)
hasState(stopLightRC,Active)
hasState(stopLightRC,Go)
hasState(stopLightRC,Slow)
numTransitionsDirect(stopLightRC,change,3)
numTransitions(stopLightRC,change,3)
hasState(stopLightRC,Stop)
state(stopLightRC,Slow) ⟵ 502  ⟵ 504
definedIn(stopLightRC,LightOnRule)
viMHasEffectIn(stopLightRC,lightOn,LightOnRule)
LightOnPrologue(stopLightRC,lightOn)
termPtr(LightOnRule<-0>5-SubForm,LightOnPrologue,stopLightRC,1)
viMHasCause(stopLightRC,LightOnPrologue,0,LightOnRule)

506 {
lightOn(stopLightRC,DefineEffect,?State,@A,state,2,SourceEntity,2) ← 516
termPtr(LightOnRule<:-0>6-SubForm,lightOn,stopLightRC,1)
lightOn(stopLightRC,DefineEffect,?Light,@A,light,2,?State,2) ← 518
termPtr(LightOnRule<:-0>7-SubForm,lightOn,stopLightRC,2)
lightOn(stopLightRC,DefineEffect,?OnPixmap,@A,onPixmap,2,?Light,2) ← 520
termPtr(LightOnRule<:-0>8-SubForm,lightOn,stopLightRC,3)
lightOn(stopLightRC,SetValueEffect,@I,?Light,@I,labelPixmap,@I,?OnPixmap) ← 522
termPtr(LightOnRule<:-0>9-SubForm,lightOn,stopLightRC,4)
definedIn(stopLightRC,LightOffRule)
viMHasEffectIn(stopLightRC,lightOff,LightOffRule)
LightOffPrologue(stopLightRC,lightOff)
termPtr(LightOffRule<:-0>5-SubForm,LightOffPrologue,stopLightRC,1)
viMHasCause(stopLightRC,LightOffPrologue,0,LightOffRule)
lightOff(stopLightRC,DefineEffect,?State,@A,state,2,SourceEntity,2)
termPtr(LightOffRule<:-0>6-SubForm,lightOff,stopLightRC,1)
lightOff(stopLightRC,DefineEffect,?Light,@A,light,2,?State,2)
termPtr(LightOffRule<:-0>7-SubForm,lightOff,stopLightRC,2)
lightOff(stopLightRC,DefineEffect,?OffPixmap,@A,offPixmap,2,Light,2)
termPtr(LightOffRule<:-0>8-SubForm,lightOff,stopLightRC,3)
lightOff(stopLightRC,SetValueEffect,@I,?Light,@I,labelPixmap,@I,?OffPixmap)
termPtr(LightOffRule<:-0>9-SubForm,lightOff,stopLightRC,4)
hasState(stopLightRC,Inactive)
numTransitionsDirect(stopLightRC,onoff,2)
numTransitions(stopLightRC,onoff,2)
inState(Slow,stopLightRC)

FIG. 64A

The state diagram engine in OML:

{ ← 534

SendEventPrologue(Event,sendEvent)
sendEvent(Event,DefineEffect,?Event,@GenSym) ← 570
sendEvent(Event,AssertValueEffect,@I,isA,@I,?Event,@E,SourceEntity)
sendEvent(Event,CallCauseEffect,@I,GenerateEvent,@I,?Event)

GenerateEventPrologue(Event,generateEvent) ← 572
generateEvent(Event,SideEffect,@Fn,SendViMEvent,4,@E,mainPanel,@E,SourceEntity,@I,0,@I,0)

*mainPanel.translations: <Message>: viMEvent("ProcessEvent") ← 574

ProcessEventPrologue(mainPanel,processEvent,?Event,?Object,?EventInstance)

processEvent(mainPanel,==,String,@I,?EventInstance,@I,0)
processEvent(mainPanel,CallCauseEffect,@I,DispatchEvent,@I,?Event)
processEvent(mainPanel,DestroyEntityEffect,@I,?Event)

DispatchEventPrologue(change,dispatch.change.Event) ← 576 dispatch.change.Event(change,CallCauseEffect,@I,DispatchEventToSubclasses,@E,stopLightRC,@E,SourceEntity)

cause(Object,DispatchEventToSubclasses,hasSubclass,2,1,FALSE,FALSE,NULL)

transitive(DispatchEventToSubclasses)

DispatchEventToSubclassesPrologue(Object,dispatchEventToSubclasses,?Event) ← 536 dispatchEventToSubclasses(Object,CallCauseEffect,@I,PerformEvent,@I,?Event,@E,SourceEntity)

PerformEventPrologue(change,perform_change_Event,?Object) ← 558

563 — perform_change_Event(change,CallPredicateEffect,@I,change,@A,state,2,?Object,2,@I,?Object,@E,SourceEntity)

560 changePrologue(Go,change.Transition,?Object,?Event)
change.Transition(Go,CallCauseEffect,@I,ExitActions,@E,SourceEntity,@I,?Object)
change.Transition(Go,CallCauseEffect,@I,PutState,@I,?Object,@E,Slow)
562 — change.Transition(Go,CallCauseEffect,@I,PutState,@I,?Object,@E,Slow)
change.Transition(Go,CallCauseEffect,@I,EntryActions,@E,Slow,@I,?Object)
change.Transition(Go,CallCauseEffect,@I,Activities,@E,Slow,@I,?Object)
change.Transition(Go,CallCauseEffect,@I,InitState,@E,Slow,@I,?Object)

572 — chaining(EntryActionsPrologue,SuperToSub)

ExitActionsPrologue(Active,exitActions.Active,?Object)

exitActions.Active(Active,==,String,@A,hasSubclass,2,SourceEntity,2,NULL)
564 — exitActions.Active(Active,CallCauseEffect,@I,LightOff,@I,?Object)
exitActions.Active(Active,CallCauseEffect,@I,ClearTimers,@I,?Object)

PutStatePrologue(Object,putState,?State)
putState(Object,DefineEffect,?OldState,@A,state,2,SourceEntity,2)
putState(Object,RetractValueEffect,@I,inState,@I,?OldState,@E,SourceEntity)
putState(Object,CreateUnitEffect,@E,SourceEntity)
putState(Object,PushUnitEffect,@E,SourceEntity)
566 — putState(Object,PutValueEffect,@I,state,@E,SourceEntity,@I,?State)
putState(Object,AssertValueEffect,@I,inState,@I,?State,@E,SourceEntity)
putState(Object,PopUnitEffect)
putState(Object,CallCauseEffect,@I,ExposeStateSpecs,@I,?State)
putState(Object,!=,String,@I,?OldState,NULL)

568 — putState(Object,CallCauseEffect,@I,ExposeStateSpecs,@I,?OldState)
572 — chaining(ExitActionsPrologue,SubToSuper)

⎱ EntryActionsPrologue(Active,entryActions.Active,?Object)
568 ⎰ entryActions.Active(Active,==,String,@A,hasSubclass,2,SourceEntity,2,NULL)
⎰ entryActions.Active(Active,CallCauseEffect,@I,LightOn,@I,?Object)

572 — chaining(ActivitiesPrologue,None)

⎱ InitStatePrologue(Object,initState,?Object)
⎰ initState(Object,DefineEffect,?InitialState,@A,initialStateOfObject,2,SourceEntity,2)
⎰ initState(Object,!=,String,@I,?InitialState,NULL)
570 ⎰ initState(Object,CallCauseEffect,@I,PutState,@I,?Object,@I,?InitialState)
⎰ initState(Object,CallCauseEffect,@I,EntryActions,@I,?InitialState,@I,?Object)
⎰ initState(Object,CallCauseEffect,@I,Activities,@I,?InitialState,@I,?Object)
⎰ initState(Object,CallCauseEffect,@I,InitState,@I,?InitialState,@I,?Object)

*FIG. 65A*

Important OML predicates for state diagram editing:

isStateOf(Go,stoplightRC) ← 538
hasTransition(Go,change, [None], [None],Slow,) ← 542, 546, 548, 550, 544, 540
hasTransition(Slow,change, [None], [None],Stop,)
hasTransition(Stop,change, [None], [None], Go,)
numTransitions(stoplightRC,change,3) ← 552
initialStateOfObject(stoplightRC,Active) ← 554
initialStateOfObject(Active,Go)
hasState(stoplightRC,Active)
hasState(stoplightRC,Go) ← 556
hasState(stoplightRC,Slow)
hasState(stoplightRC,Stop)
statesOf(stoplightStates,stoplightRC)
hasStatesOf(stoplightRC,stoplightStates)
isA(Go,Active)
isA(Slow,Active)
isA(Stop,Active)

State Diagram Processing

DetermineAttributeType:
  Determines type of Destination
TypesMatch:
  See if Attribute Type is compatible
  with the Destination Type This diagram will generate the following SQL statements:

626 { CREATE TABLE"firstTable"("firstColumn"VarChar(40),
         "secondColumn"VarChar(40),"thirdColumn"VarChar(40)
       and
       CREATE TABLE"secondTable"("fourthColumn"VarChar(40)

SOFTWARE DEVELOPMENT SYSTEM WITH AN EXECUTABLE WORKING MODEL IN AN INTERPRETABLE INTERMEDIATE MODELING LANGUAGE

BACKGROUND OF THE INVENTION

A recognized problem in the field of software development is error in translation from specified requirements to a working program. According to one software development model, a written specification which describes planned behavior for the program is created prior to beginning development of any software code. The specification is meant to be used by software engineers as a guide when writing the code so that the program functions as planned. However, because the specification may be inaccurate, incomplete and describe a poor design, and because the software engineers may fail to precisely follow the specification during development, the resulting program may differ from the planned program. If the differences are significant enough, the program may have to be rewritten or otherwise altered. As a result, development time and development costs are increased.

BRIEF SUMMARY OF THE INVENTION

A software development tool which utilizes an intermediate object modeling language is disclosed. The structure of the desired program is first described graphically by generating rule diagrams, state diagrams, and object diagrams such as user interface diagrams, event diagrams and other object diagrams. The development tool employs the diagrams to generate a working model of the program expressed in the object modeling language. The working model of the program can be executed without lengthy compiling, and hence program behavior can be quickly observed and tested. Further, the behavior of the working model can be quickly and easily changed by modifying the diagrams until the desired result is achieved. Source code is then generated from the object modeling language and compiled to create the final program.

Classes and associations which inter-relate classes are employed as fundamental constructs in the diagrams and object modeling language. No distinction is drawn between classes and instances. This trait is desirable, for example, when an analyst discovers that an object classified as an instance actually has several occurrences, each possibly with different characteristics. It is desirable in such an event to directly subclass that object rather than create a new class that captures the characteristics of the object in general and reclassify the object as an instance of that new class.

One advantage provided by the development tool is direct development and implementation of program specifications. The diagrams facilitate development of a program specification or "business model" for the program by visually organizing and representing real world systems in an intuitive manner. Hence, the program specification may be directly developed diagrammatically. Further, since the tool employs the diagrams to create source code, human errors in translating the specification to code are eliminated.

Another advantage provided by the development tool is speedy implementation of modifications during development. Known development environments typically require implementing changes in source code and then compiling the source code to create a working program that can be tested to determine whether the changes produce the desired result. By contrast, the modeling language of the present development tool is automatically modified to reflect changes in the diagrams and can be directly executed without lengthy compilation. As a result, program changes can be implemented and observed in a shorter amount of time.

BRIEF DESCRIPTION OF THE DRAWING

The invention will be more fully understood in view of the following Detailed Description of the Invention and Drawing, of which:

FIG. 2 is an object diagram;

FIG. 3 is a user interface diagram;

FIG. 4 is a palette of predefined objects;

FIG. 5 is a state diagram;

FIG. 14 is an object diagram;

FIG. 15 is a planned association;

FIGS. 16–30 illustrate rule actions;

FIGS. 31–51 illustrate expressions;

FIG. 56 illustrates operation of the assertion interpreter;

FIG. 57 is an object diagram associated with a traffic light example program;

FIG. 58 is an event diagram associated with the example program;

FIG. 59 is an object diagram associated with the example program;

FIGS. 63–65 illustrate object modeling language code associated with the example program;

DETAILED DESCRIPTION OF THE INVENTION

Figure 1:
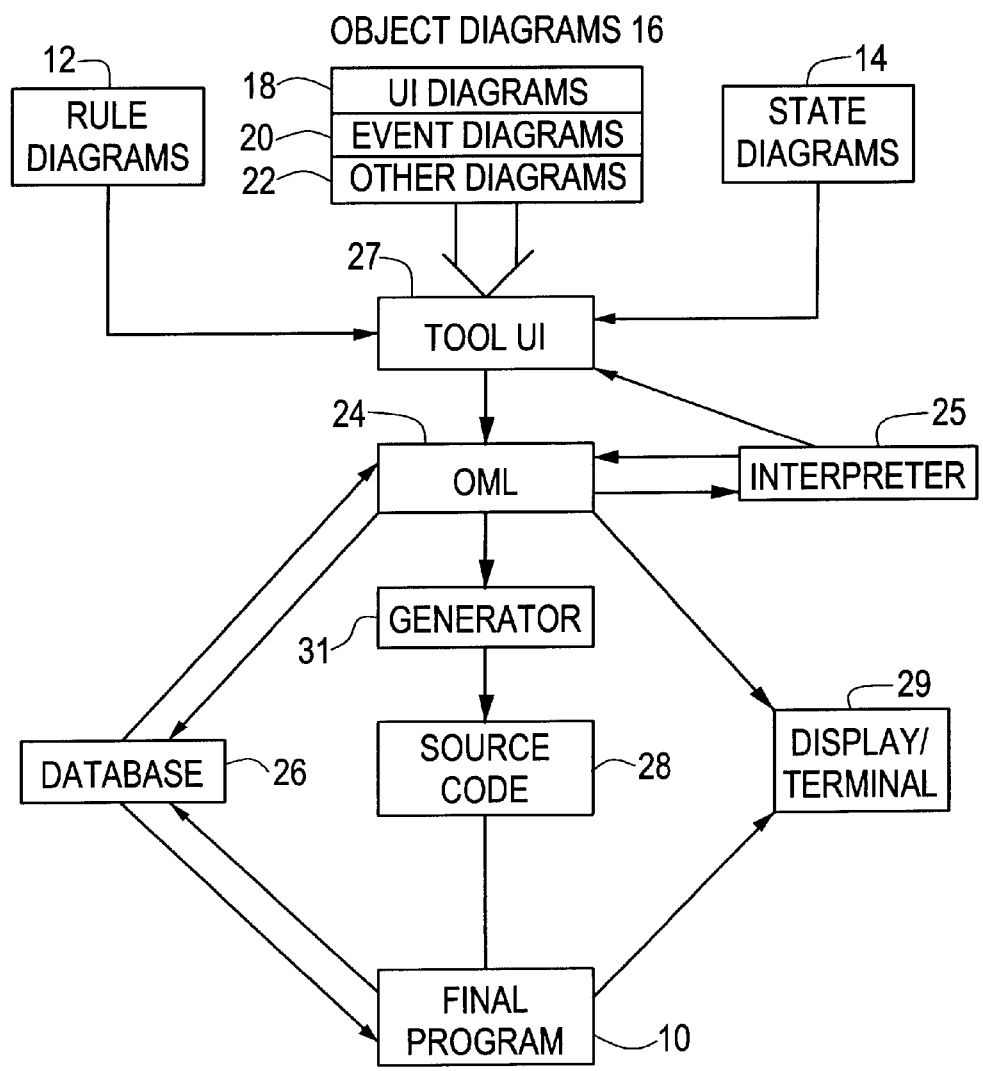
FIG. 1 is a block diagram illustrating operation of the software development tool.

An operational overview of the software development tool is illustrated in FIG. 1. The development tool provides the user with a graphic environment for development of a software program 10. More particularly, the desired operation of the program 10 is first represented diagrammatically using rule diagrams 12, state diagrams 14, and object diagrams 16 including user interface diagrams 18, event diagrams 20 and other object diagrams 22. While such diagrams are being formed, a representation 24 of the program is contemporaneously and automatically made in an object modeling language by employing an interpreter 25 and user interface 27 to determine meaning from the diagrams. The representation of the program in the modeling language is operational and can utilize both a database 26 for retrieval and storage of information and a display/terminal 29 for I/O functions. Because the modeling language representation of the program is operational, it may be employed to determine whether the final program 10, which is expressed in another language, will function as planned. If program changes are necessary, the diagrams are modified by the user and the modeling language representation 24 is automatically modified by the development tool to reflect the diagram changes. Source code 28 in a selected object oriented language such as C++ is created from the modeling language representation 24 by a generator 31 when all desired changes have been made. The source code 28 is then compiled to generate the final program 10.

FIG. 2 illustrates an object diagram. The object diagram includes a plurality of objects represented by rectangular blocks. Objects may be linked together by associations which are represented by lines between objects. Associations represent relationships between classes, and are generally described with text strings. For example, a Manager object 30 is connected to a Department object 32 by a "manages" association 34. Hence, the manager manages a department.

Associations which represent many-to-one, one-to-many and many-to-many relationships are indicated by multiplicity dots 36. In particular, a multiplicity dot is associated with an object to indicate that the object can be "many" in the relationship defined by the association. For example, a requisitioner 38 may create 40 many purchase requisitions 42, and the purchase requisition 42 may list 44 many items 46.

Object inheritance may be established by connecting objects with an inheritance association 48 which is represented by a line and triangle and indicates an "is a" type relationship, sometimes referred to using the terms "class, subclass and superclass." For example, Manager 30 "is an" Employee 49, and hence Manager is a subclass of the superclass Employee. Further, a plurality of subclasses may be connected with an inheritance association and collectively connected to a superclass. For example, Manager 30 is a superclass of Comptroller 50, Chief Executive Officer 52, Department Manager 54, Chief Financial Officer 56 and Vice President 58.

FIG. 3 illustrates a user interface diagram 18 (FIG. 1) The user interface diagram is a form of object diagram which is employed to create a user interface for the program. Aggregation associations 60 which indicate that an object 62 is an element of another object 64 are represented with a line and a diamond. In particular, a line is drawn between the two objects with the diamond pointing towards the aggregate. If multiple objects share a single aggregate, lines from all the objects converge into a single line which is connected to the aggregate by another line. Aggregation associations 60 may be employed with any object diagram.

Referring to FIG. 4, a palette of predefined objects and structures containing multiple objects are provided to facilitate creation of commonly used interface features such as windows, buttons and fields, e.g., XmTextField 66. Further, user developed objects and structures may be added to the palette.

FIG. 5 illustrates a state diagram 14 (FIG. 1). The state diagram includes labeled states which are interconnected by transitions. The illustrated states include an Active state 68, a Requisitioning state 70, a Creating Requisition state 72, a Manager reviewing state 74 and other states. The illustrated transitions include a Forward transition 76, a Forward/Manager Approved transition 78, a Forward transition 80, a Forward/VP Approved transition 82 and a Forward/Contracts Manager Approved transition 84.

The state diagram is associated with at least one object, and defines different states of objects modeled in the state diagram and state sequences caused by inputted events. Transitions are labeled with the event which causes the transition to occur. For example, the forward event 76 is required before transitioning from the Creating Requisition state 72 to the Manager Reviewing state 74. States may be nested within superstates referred to as "contours." For example, Requisitioning 70 is a contour containing the substrates Creating Requisition 72 and Manager Reviewing 74. Entry points into contours and states are defined by solid circles 86.

Figure 6:
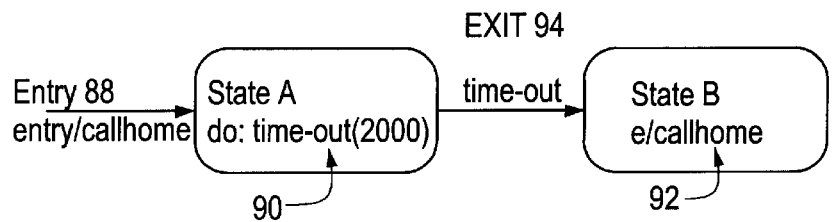
FIG. 6 is a state diagram which further illustrates actions.

Referring to FIG. 6 in which a portion of a state diagram is illustrated, actions may be set to occur when an object reaches a chosen state. Possible types of actions include: an entry action 88, a do action 90, an event action 92, and an exit action 94. Entry actions 88 are triggered immediately upon entry of the associated state. Do actions 90 trigger after entry actions 88 complete and continue until completed or the occurrence of an event that causes a transition out of the associated state. Event actions 92 are triggered when a predetermined event occurs. However, such an event does not cause a transition to another state. Exit actions 94 trigger immediately before leaving the associated state.

The actions may be defined in various different ways. For example, if an action is defined as a "cause," the development tool will execute any rule cause having the same name as the action. If the action is defined as an "event," the development tool causes that event to occur. The occurrence of such an event may lead to the firing of a transition or the occurrence of an event action. If the action is defined as a "timer," a timer function is executed. The timer function has an integer argument. The timer generates the event after the number of time units (milliseconds) indicated by the argument has elapsed. Actions may also take place on transitions. When the transition fires, the action is executed before entering the new state.

Figure 7:
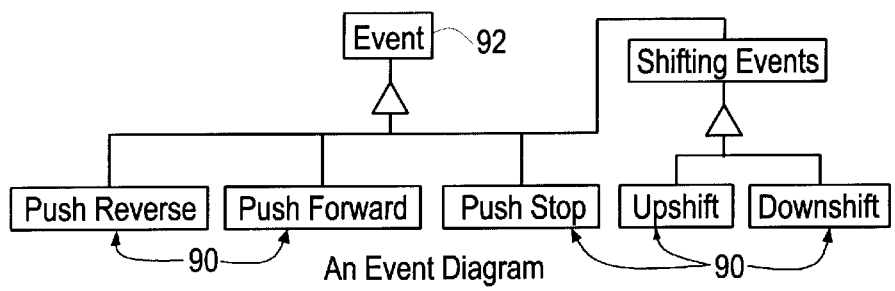
FIG. 7 is an event diagram.

FIG. 7 illustrates an event diagram 20 (FIG. 1). All events that affect transitions in the state diagram are defined in an event diagram, which is a type of object diagram. In particular, the event diagram is an object diagram in which events 90 are defined as objects. For clarity, each of the event objects is made a subclass of a predefined Event object 92.

Figure 8:
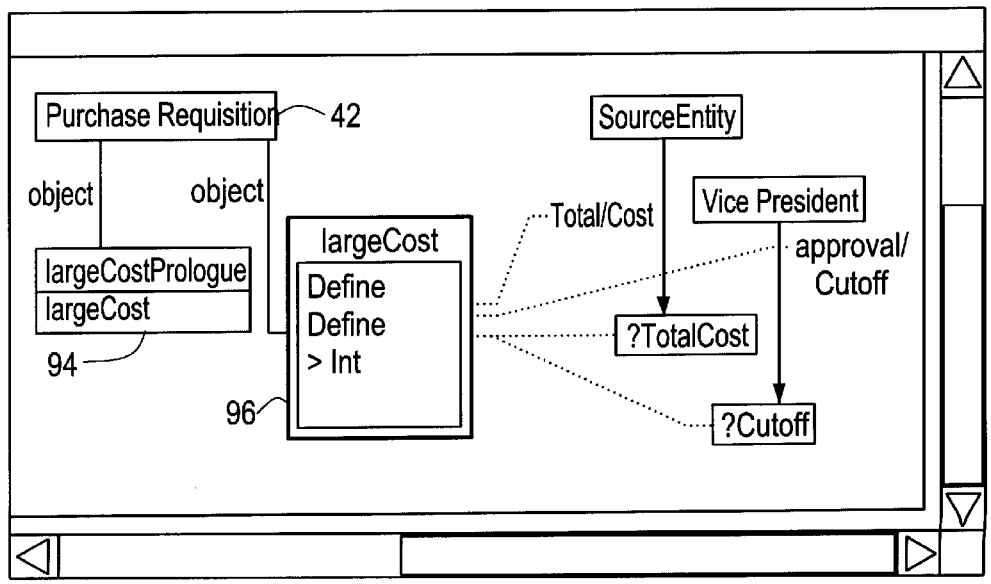
FIG. 8 is a rule diagram.

FIG. 8 illustrates a rule diagram 12 (FIG. 1). Rule diagrams define activity in the program, and are employed to extend object diagrams and state diagrams such that the program operates in the desired manner. The rules defined by the diagram includes causes 94 and effects 96, and may be executed from other rules or a state diagram. When a rule is executed, the development tool searches for a cause having a name matching the name of the rule and attempts to execute that cause. In particular, when the object associated with the state diagram reaches the specified state, the entry action is executed, and hence the cause is executed. When the tool executes a rule, it searches for a cause that is bound to a particular specified object 42. If such a cause does not exist, then a cause that is bound to the immediate superclass of that particular object is sought. If such a cause does not exist at the immediate superclass, the tool continues searching upwards in the inheritance hierarchy until a matching cause is located.

Figure 9:
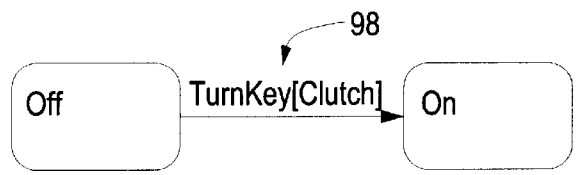
FIG. 9 is a state diagram which illustrates interaction between states and rules.

Referring to FIG. 9, a transition 98 may be conditionally fired based on a rule. In particular, the transition may be associated with a rule, and if a specified event, e.g., Clutch, occurs then the rule is executed. If the rule completes then the transition is fired. If the rule does not complete then the transition is not fired.

Figure 10A:
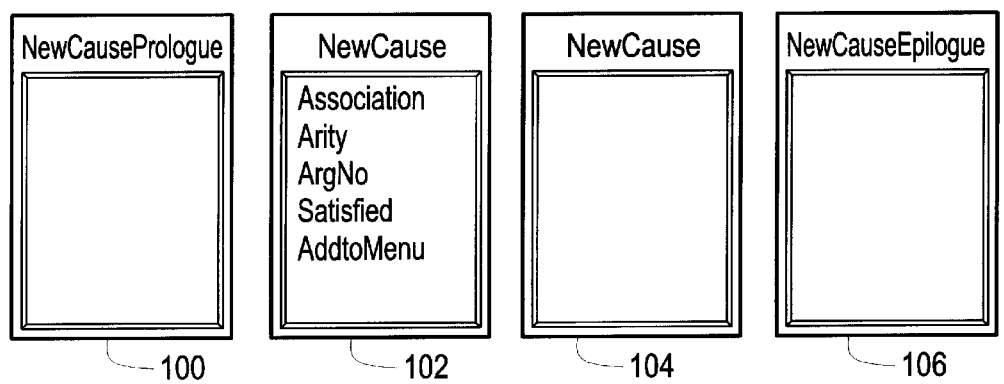
FIG. 10A illustrates cause segments.

Referring to FIG. 10A, there are four types of cause segments 94 (FIG. 8): prologue 100, iterator 102, middle 104 and epilogue 106. The causes are arranged in a hierarchy that defines order of execution. In particular, prologues 100 occur first, followed respectively by iterators 102, middles 104 and epilogues 106. Each cause is bound to an object in a one-to-one relationship, and may contain a list of parameters and alternatives.

Figure 10B:
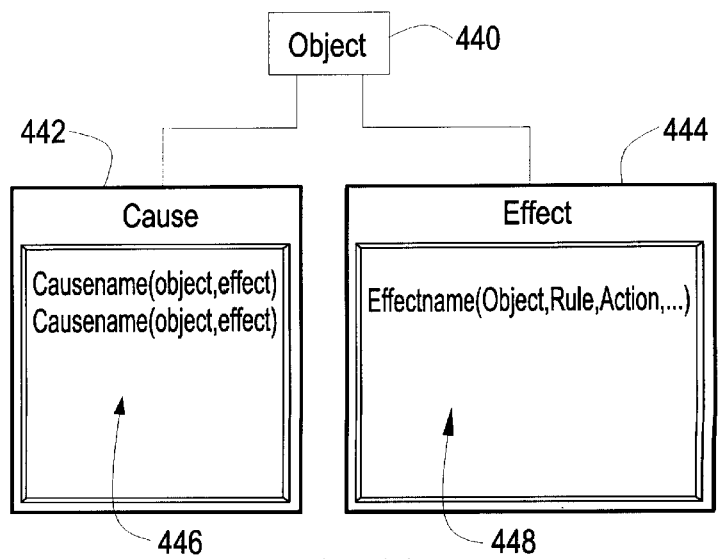
FIG. 10B illustrates a rule.

Referring to FIG. 10B, rules are employed to implement methods in the object modeling language. Rules are comprised of an object 440, a cause 442 and an effect 444. The cause 442 and effect 444 are modeled as associations with a specific form.

The cause 442 is comprised of a set of cause alternatives 446, each of which is an association. For example, a cause Pays on object Company could take the form: Company Pays (with alternative) PaysExempt and parameters (P1, P2 through Pn), and Company Pays (with alternative) PaysNonexempt and parameters (P1, P2 through Pn). The alternatives are related rules that can be invoked by a single name. First level rules take the form:
<CauseName>(<Object>,<Effect>1)
<CauseName>(<Object>,<Effect>2)
<CauseName>(<Object>,<Effect>n),
where <Effect>1 through <Effect>n are names of effects. The cause rule applies to an object if the object name matches the first argument of the rule or, if inherited (<CauseName>) is asserted (default), then the rule is applied if the object is a subclass of the first argument. Rules for superclasses are masked by more specific rules, unless the more specific rule is terminated by a failed conditional effect.

Each effect 444 is a set of actions triggered by the execution of a cause alternative 446. Actions 448 are modeled as associations with a specific form. For example, an action PaysExempt could take the form: Company PaysExempt (with action) Action and arguments (A1, A2 through An). Each action 448 is any one of a set of predefined actions including actions to add and remove associations, define variables, evaluate a condition, call other causes, and perform user-interface and database functions. Arguments form expressions that are evaluated and used as arguments of the action. Expressions include calling an external function, returning an attribute value, and performing arithmetic functions.

At execution time, each rule action 448 (<Effect>1 through <Effect>n) in the effect 444 is applied in order from first to last. Semantically, rule actions take the form: <EffectName>(<Object>,<EffectOperator>, . . . ). Rules for superclasses are masked by more specific rules regardless of whether the more specific rule is terminated by a failed conditional effect.

Cause alternatives 446 are executed in the order that they occur, stopping on the first alternative that succeeds. A cause alternative succeeds when the corresponding effect succeeds. As stated above, effects are executed in order of occurrence, until a conditional action fails or the last effect is completed. When the last effect is completed, the effect succeeds. If none of the cause alternatives succeeds, then the cause fails.

The rule applicable to a given object is bound at run-time, the applicable rule being the innermost rule in the generalization hierarchy. If that cause fails, a more general cause (the innermost more general cause) is invoked and so on until a cause succeeds or no more causes are found.

Figure 11:
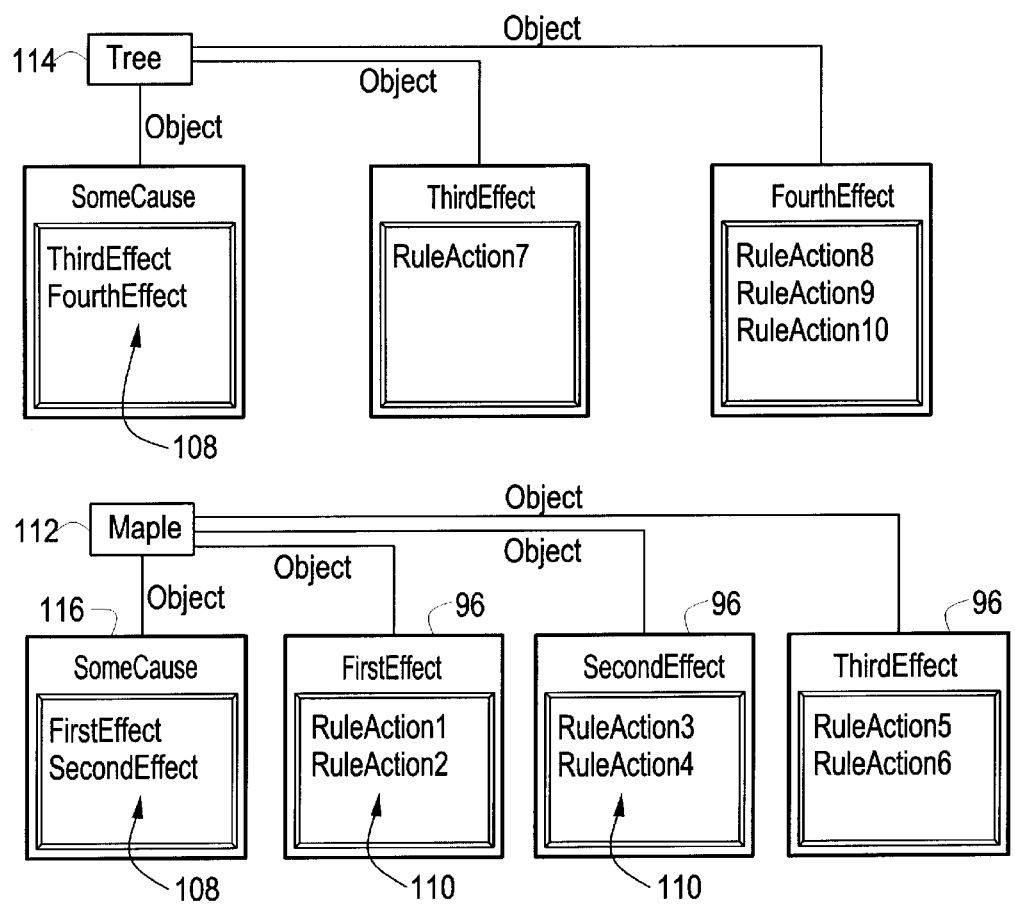
FIG. 11 illustrates use and interaction of cause segments.

Referring to FIG. 11, each alternative 108 in a cause is associated with a corresponding effect, and each effect is bound to one object. Each effect contains a list of rule actions 110 which are predefined routines. When an alternative 108 is executed, the tool searches for and attempts to execute an effect 96 of the same name that is bound to the same object as the cause. When an effect 96 is executed, execution of each associated rule action 110 is sequentially attempted. If all of the rule actions 110 are successfully completed, the cause 116 that called the effect is also completed. If a rule action is not successful, execution of that effect terminates and the next alternative 108 is attempted. Similarly, if an alternative specifies execution of an effect that is not bound to the desired object, the tool searches upwards in the inheritance hierarchy until the appropriate effect is located.

It should be noted that a cause and effect need not be bound to the same object. For example, given a state diagram attached to an object Maple 112 which is a subclass of Tree 114, where Maple calls a rule named SomeCause (not illustrated), the cause SomeCause 116 is executed. Since there is no effect which is named "SomeEffect" and bound to Maple, the effect bound to the superclass of Maple 112, i.e., Tree 114, is executed.

The alternatives are performed sequentially. If any of the alternatives 108 in the cause completes successfully, then the cause is said to be successful and the rule is complete. If an alternative is not successful, i.e., the 'corresponding effect failed, the tool continues to attempt execution of each alternative in the cause sequentially until either an alternative is successful or the list of alternatives is exhausted. If the list is exhausted then the cause fails.

The rule actions 110 are performed sequentially. If a rule action is performed successfully, the tool executes the next sequential rule action. If any rule action fails, the associated effect fails and the subsequent rule actions are ignored. In a cause, the alternatives are also performed sequentially. Once an alternative is completed successfully, the cause is successful and the subsequent alternatives are ignored. If an alternative fails, the next sequential alternative is attempted, continuing until either an alternative is successful or the list is exhausted. If the list is exhausted, the cause fails.

If a cause is not successful, the tool searches for a cause with the same name that is bound to the original object's superclass and begins executing that cause's alternatives. The alternatives in this cause are also performed sequentially until one either succeeds or fails. The tool continues to execute causes upward through the inheritance hierarchy until one succeeds.

It should be noted that if a cause is being executed for a superclass of the original object, the search for an effect. begins with the original object, and not the superclass that the cause is bound to. For example, given that the object Maple 112 is a subclass of Tree 114, when a cause named SomeCause 116 is to be executed on Maple the first alternative 108 in this cause is "FirstEffect" and so the effect 96 "FirstEffect" which is bound to Maple 112 is attempted. If the rule actions 110 in this effect (RuleAction1, RuleAction2) fail, then the next alternative in SomeCause, SecondEffect, is attempted. If this effect's rule actions (RuleAction3, RuleAction4) also fail, then the cause Some-Cause fails since no other alternatives exist, and the tool searches for another cause named SomeCause that is bound to a superclass of Maple. Finding such an entity, the cause in the top part of the figure, the tool executes it. The first alternative in this cause is ThirdEffect. Since the search for the appropriate effect begins with the effect bound to the original object, the effect that is executed first is the ThirdEffect that is bound to Maple. If this effect's rule actions (RuleAction5, RuleAction6) also fail, the next alternative to be executed is FourthEffect. However, since there is no such effect bound to Maple, the tool searches the superclass and executes the effect FourthEffect that is bound to Tree.

Figure 12:
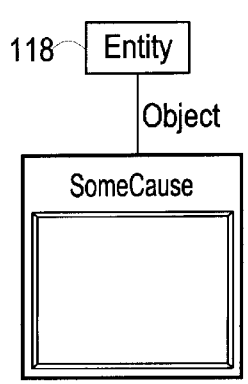
FIG. 12 further illustrates a cause segment.

As shown in FIG. 12, a predefined Entity object 118 is disposed on the apex of the inheritance hierarchy for each object. As a result, causes and effects may be bound to the entity object, and a cause or effect bound to the entity object is executed if the search is otherwise exhausted.

Figure 13:
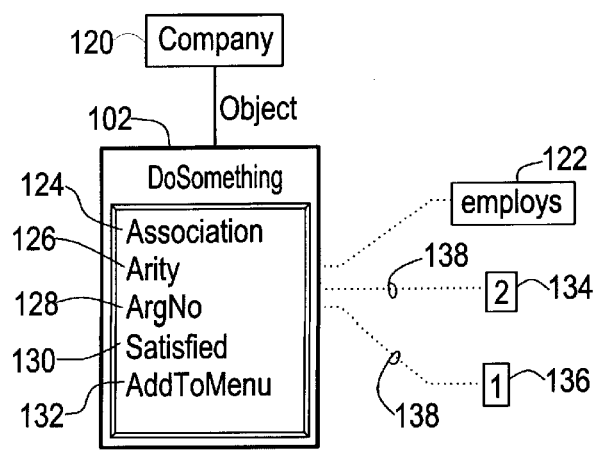
FIG. 13 illustrates an iterator.

Referring to FIG. 13, an iterator 102 allows performance of a cause on all of the objects involved in a particular association. More particularly, an iterator takes an association name and an object name and returns all of the objects in the application that have that association with that object. The rules for a cause may be invoked by using a rule which contains CallCauseEffect: <EffectName> (<Object>, CallCauseEffect, @I, <CauseName>, @E, obj) which applies the <CauseName> cause to obj. Each application of cause consists of three parts: a prologue, a middle, and an epilogue. The prologue applies the cause rules with functorId equal to <CauseName> Prologue. The rules with first argument a superclass of obj are applied in order of appearance. The epilogue is analogous to the prologue, except that the name <CauseName>Epilogue is used. Processing for the middle part is dependent upon a cause definition of the form: cause (<Object>, <CauseName>, <FunctorId>, <Arity>, <EntityPosition>, Boolean, Boolean, NULL). The cause definition applies if the cause target entity (e.g., obj) is a subclass of <Object>. The <CauseName> must match.

Cause rules are applied to a set of entities that are found by examining all terms such that the functor equals <FunctorId> with arity <Arity>. If the cause target entity (e.g., obj) is at argument position <EntityPosition> in the term, then all entities at the other argument positions are added to the set. For example,
Example 1:
   cause (Node,markIt,reaches,2,1,False,False, null)
   reaches (obj,abc)
   reaches (obj,uvw)
   reaches (obj,xyz)
   reaches (x,y)
   The markIt rules are applied to abc,uvw and xyz in turn.
Example 2:
   cause (Node,markIt,reaches,2,2,False,False,NULL)
   reaches (abc,obj)
   reaches (uvw,obj)
   reaches (xyz,obj)
   reaches (x,y)
   The markIt rules applied to abc,uvw and xyz in turn.
Example 3:
   cause (Node,markIt,reaches,2,1,False,False,Null)
   transitive (markIt)
   reaches (obj,abc)
   reaches (obj,uvw)
   reaches (obj,xyz)
   reaches (x,y)
   reaches (abc,def)

The markIt rules are applied to def as well as abc, uvw, xyz. Also, markItPrologue and markItEpilogue are applied to abc,uvw,xyz,def, as well as obj. The first Boolean field indicates whether it is possible (legal) for a CallCauseEffect to result in no applicable causes, because there is no Prologue or Epilogue effect and no matching terms. If FALSE, no applicable causes will result in a warning message. The second boolean field is obsolete. The last field is reserved for future use. There are two special cases that apply to cause definitions. The first is: cause (Object>,<CauseName>, NULL,1,1,FALSE,TRUE,NULL) For this definition, the prologue and epilogue phases are as normal. However, the middle phase applies rules with functor equal to <CauseName> directly to the cause target object (e.g., obj). This allows for "calls" directly to the middle rules of a cause (the Prologue suffix is not added). Finally, effect rules may be called directly using CauseEffectsEffect, which takes two arguments, the effect name, and the target object.

If a cause has any middles, these middles are performed on the returned objects. As such, an iterator could be used to perform a cause on all the objects that Company 120 employs 122. The iterator has five predefined arguments: Association 124, Arity 126, ArgNo 128, Satisfied 130 and Add to Menu 132. Values must be provided for the first three arguments, Association, Arity and ArgNo, by creating an object 134, 136 of the desired value and drawing a control line 138 from the argument name to the value object. The Association value 122 indicates the name of the association being iterated over. The Arity of an association 134 is an integer value indicating the number of objects involved in an instance of the relationship, typically two. ArgNo is an integer value 136 which tells the iterator which end of the association you wish to perform the iterator's middles on. Since associations are typically binary (arity of two), ArgNo is typically one or two.

Referring to FIGS. 13 and 14, iterators must be bound to an object 120. Further, this object becomes an argument in the association being iterated over and whose placement in the association is determined by ArgNo. Given these arguments, the iterator returns all of the objects, if any, that satisfy the criteria. For the illustrated example, the arity of two indicates that the association employs 122 is binary. The ArgNo, one, indicates that the bound object Company 120 belongs in the first position of the association. In other words, 'Company employs something,' with 'something' being an unknown quantity. If ArgNo was set to two, the bound object would be in the second position in the association, in other words, 'something employs company.' For the 'Company employs something' relationship, the iterator returns all of the objects that Company employs. Since the association in FIG. 14 is 'Company employs Tom,' 'Company employs Ted' and 'Company employs Bill,' the iterator returns the objects Tom, Ted and Bill. If ArgNo is set to two, the returned set is empty, since there is not an object that 'employs' company.

As the tool iterates over an association, it attempts to perform a middle for each returned object. In the previous example, the search was for a middle named "DoSomething" bound to Tom 140. The search for this middle operates in the same manner as with any other cause segment, viz., if such a middle does not exist, a DoSomething middle is searched for that is bound to the superclass of Tom and so on. Once the middle for Tom is performed, the procedure is repeated for the objects Ted 142, Bill 144 and any other objects that are returned by the iterator.

Parameters are passed from causes to rule actions and expressions by creating an object which is a variable whose name matches that of the parameter. The value of the parameter is passed to the cause from the calling action. Parameters may only be accessed by effects that are called from the cause segment that contains the parameter.

FIG. 15 illustrates a "planned association." Planned associations are associations that do not exist until established by a rule action. Once a planned association is established, it operates in the same manner as any other association. Planned associations may be used to read and write values from variables.

Referring to FIGS. 16 and 17, rule actions 110 define the actual execution of a rule. For example, an "Assert" rule action 146 activates a planned association. When the rule action is executed, the association is added to the database. As an alternative to planned associations, the Assert action may take the Argument expression as a parameter. A "Put" rule action 150 activates a planned association. When the rule is executed, the association is added to the database. The Put rule action is similar to the Assert rule action except for the behavior when a similar statement already exists in the database. As with Assert, if an identical statement already exists in the database, the statement is not duplicated. However, if a statement with an identical association and source object but with a different destination object already exists, the existing statement is overwritten with the new one.

Referring to FIG. 18, a "Retract" rule action 152 removes relationships from the database. When this rule is executed, the term represented by the indicated association is removed from the database, provided such exists. If the term being retracted does not exist, this rule action has no effect. If the database contains multiple occurrences of the term being retracted, all occurrences are deleted. As an alternative to planned associations, the Retract rule action may take a list of arguments as a parameter. Wildcards may also be used by the Retract rule action. The underscore character, represented as an object, may take the place of either the source or destination object. All terms in the database that match the parameter pattern are deleted from the database.

Referring to FIG. 19, a group of rule actions are provided for manipulating the creation, destruction and visibility of user interface objects. "Popdown" 154 dismisses a displayed object. "Popup" 156 displays an object. "Recreate" 158 will recreate all the objects in the application, including generating new user interface objects and setting their resources. "Set Value" 160 changes the value of an object's resource without writing the change to the database.

Referring to FIG. 20, a "Define" rule action 162 is used to assign values to variables. When the Define rule action is executed, the value is assigned to the variable. Define From Resource 164 gives a variable a value based on the value of a object's resource. Define With Inheritance 166 gives a variable a value based on an object's inherited attribute value. A "Compare" rule action 168 is used to make comparisons between integer values or string values. A "Call" rule action 170 is used to make calls to other routines. A "Unit" rule action 172 is used to read and write units to external files. Various other rule actions may be defined.

Figure 21:
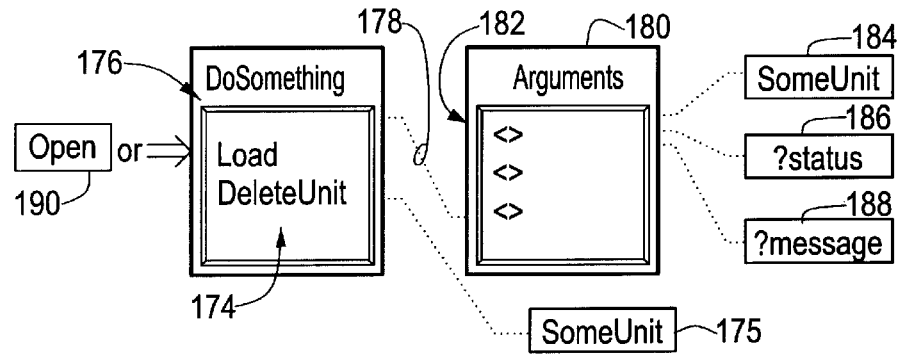

Referring to FIG. 21, a Delete Unit 174 rule action attempts to delete an already existing unit indicated by an associated object 175. Deleting a unit also deletes all of the statements that the unit contains. Load 176 attempts to load a unit into the database from an external file. To define a Load, a control line 178 is formed between Load and an Arguments expression 180 containing three operands 182. The first operand is drawn to an object 184 representing the unit name being loaded. The second operand 186 and third operand 188 are drawn to objects which represent variables corresponding to the values returned from the attempted load operation.

The Open 190 rule action attempts to open a unit. To define an Open a control line is drawn from Open to an Arguments expression containing three operands. The first operand is drawn to an object representing the unit name being opened. The second and third operands are drawn to objects which represent variables corresponding to the values returned from the attempted open operation. The first variable is the returned status value and the second is the returned message value.

Figure 22:
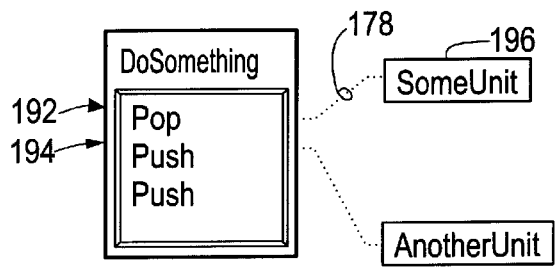

Referring to FIG. 22, the Pop 192 rule action pops the top unit off of the unit stack, i.e., when this rule action is executed, the top unit on the stack is removed. The unit beneath the popped unit then becomes the current unit. Once the stack is empty, there is no current unit and all additions to the database are added only to the database itself.

The Push 194 rule action pushes a unit onto the unit stack. To define a push a control line 178 is drawn from Push to an object 196 representing a unit name. When the Push rule action is executed, the indicated unit is pushed onto the unit stack and becomes the current unit. This unit remains the current unit until a Set rule action is performed or the unit stack is manipulated.

Figure 23:
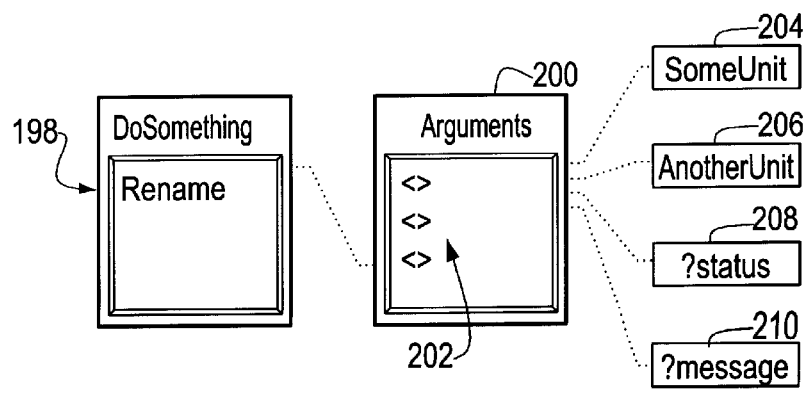

Referring to FIG. 23, the Rename 198 rule action changes the name of a specified unit. To define a Rename action a control line is drawn from Rename to an Arguments expression 200 containing four operands 202. The first operand is drawn to an object 204 representing the unit name being changed. The second operand is drawn to an object 206 representing the desired name. The third and fourth operands are drawn to objects 208, 210 respectively which represent variables corresponding to the values returned from the attempted rename operation. The first variable (indicated by object 208) is the returned status value and the second variable (indicated by object 210) is the returned message value.

Referring to FIG. 24, the Save 212 rule action saves a unit to an external file. To define a Save action a control line is drawn from save to an arguments expression 214 containing three operands 216. The first operand is drawn to an object 218 representing the unit name being saved. The second and third operands are drawn to objects 220, 222 respectively which represent first and second variables corresponding to the values returned from the attempted save operation. The first variable is returned status value and the second is the returned message value. When this rule action is executed, all of the statements in the indicated unit are saved to the external file indicated by the last Set Location rule action that was executed for the unit.

Referring to FIG. 25, a Set 224 rule action indicates which unit is to be the current unit. To define a set action a control line is drawn from set to an object 226 representing a unit name. When the rule action is executed, the indicated object becomes the current unit. Once the current unit is declared, all subsequent additions to the database are also added to the unit. This unit then remains the current unit until either a new Set rule action is performed or the unit stack is manipulated.

Referring to FIG. 26, a Set Location 228 rule action specifies an external file specification, that is read or written to when the matching unit is saved or loaded, that corresponds to a given unit. To define a Set Location action a control line is drawn from Set Location to an Arguments expression 230 containing two operands 232. The first operand is drawn to an object 234 representing the unit name and the second operand is drawn to an object 236 representing the desired file specification. If the file specification contains a file name without a path name, the path is assumed to be the current working directory. When this rule action is executed, the indicated unit is tied to the indicated file specification for all further input-output operations. For example, when the illustrated effect is executed, the Set Location rule action sets the unit SomeUnit to the file specification c:\somepath\unitfile.fil. It is this file that will be manipulated whenever subsequent rule actions save or load SomeUnit.

Referring to FIG. 27, the Set Ordered 238 rule action controls the order in which object modeling language statements are added to a unit. To define a Set Ordered action, a first control line is drawn from Set Ordered to an object 240 representing the name of a unit and a second control line is drawn from Set Ordered to an object 242 representing one value selected from TRUE and FALSE. The object being ordered must exist. When the rule action is executed, the ordering option for the object in question is set to an appropriate Boolean value. If the ordering option for a unit is TRUE, all subsequent additions to the unit are grouped by the first argument. If the ordering option is FALSE, new statements are appended to the end of the unit. For example, when the illustrated effect is executed the Set Ordered rule action turns the ordering option to TRUE. After the effect is completed, the unit will have the assertions in the following order: Company 244 employs 246 Bill 248, Bill owns 250 Boat 252, Bill drives 254 Car 256, and Ted 258 buys 260 Car.

If the same effect is performed with the Boolean value for Set Ordered set to False, the assertions are added to the unit in chronological order: Company 244 employs 262 Tom 264, Bill owns Boat, Ted buys Car, Bill drives Car, and Company employs Bill.

Figure 28:
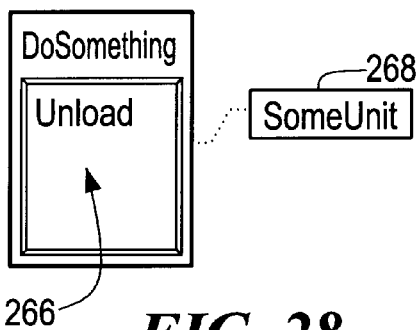

Referring to FIG. 28, the Unload 266 rule action removes all the statements from a unit but does not delete the unit. To define an Unload action, a control line is drawn from Unload to an object 268, the name of which must be that of an existing and loaded unit. When the rule action is executed, the statements in the unit are removed, essentially emptying the unit. The statements are also removed from the database. For example, the illustrated Unload rule action deletes the unit "SomeUnit" as well as the contents of SomeUnit.

Figure 29:
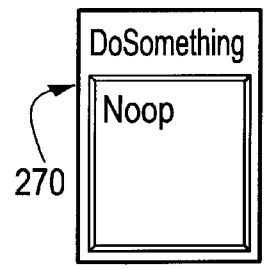

Referring to FIG. 29, Noop 270 is a no operation command. When this rule action is executed, nothing happens and execution continues with the following rule action.

Figure 30:
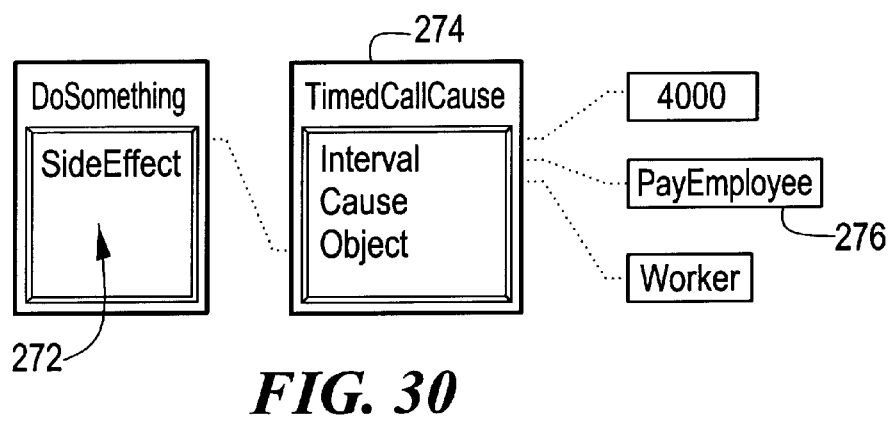

Referring to FIG. 30, Side Effect 272 is a no operation command that evaluates the expressions to which it is bound. To define a Side Effect action, a control line is drawn from Side Effect to either a TimedCalledCause expression 274 or a Function expression. When this rule action is executed, the rule action itself does nothing but the expressions that are controlled from Side Effect are executed. For example, the illustrated Side Effect rule action executes the TurnedCallCause expression of a PayEmployee cause 276.

Expressions, which are illustrated in FIGS. 30–51, are predefined functions for use in rule diagrams. The result of an expression can be used as an argument to another expression or to a rule action. The value of operands associated with an expression are indicated by drawing a control line from the operand name in the expression box to the argument. The user is notified if the argument is out of context for the operand. In order for an expression to function, every operand must have a value.

Figure 31:
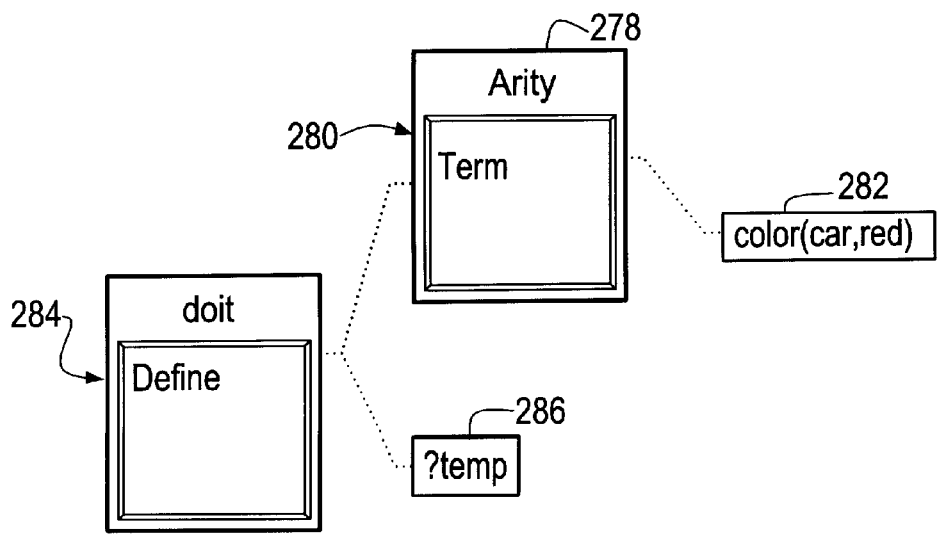

Referring to FIG. 31, the arity 278 of an association is the number of objects involved in the associated relationship. This expression has one operand, Term 280, and allows determination of the arity of a given association. In particular, the expression returns the arity of an argument as an integer. The Define 284 rule action sets the value of ?temp 286 to two since the arity of the term color(car,red) 282 is two.

Figure 32:
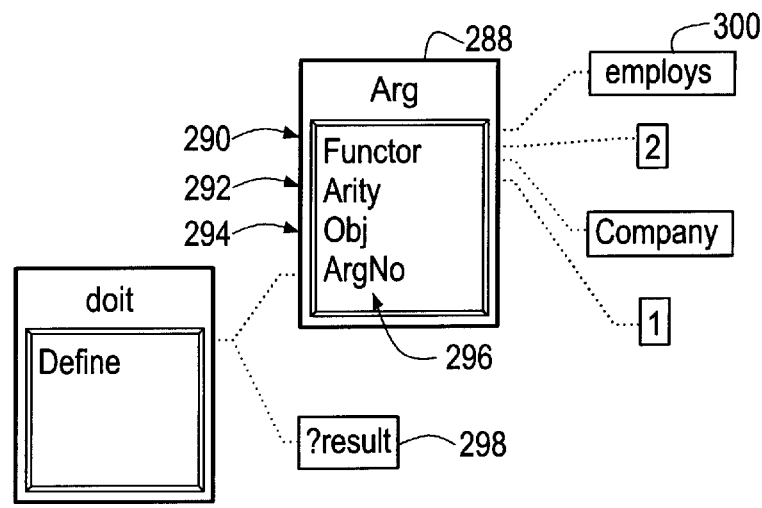

Referring to FIG. 32, the expression Arg 288 allows determination of the value of an argument in an object modeling language term that exists in the current database. Essentially, the Arg expression 288 allows an object modeling language browser-type search from a rule diagram. The Arg expression has four operands. The first operand, Functor 290, is the functor of the object modeling language term you wish to search for. The second operand, Arity 292, is an integer that represents the arity of the term. The third operand, Obj 294, is the first argument in the term. At execution, the existing object modeling language is searched for the first occurrence of a term that satisfies the criteria and returns the value of the argument specified by ArgNo 296. ArgNo may not be greater then the arity of the object modeling language term. As illustrated, Arg 288 searches the database for the first occurrence of a term employs (Company,_). The effect sets ?result 298 to the value of the matching term, with ArgNo set to two.

Figure 33:
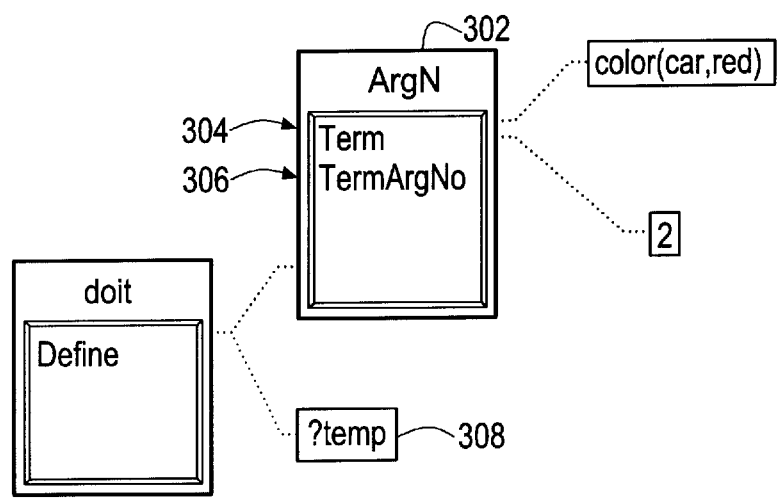

Referring to FIG. 33, ArgN 302 allows determination of the value of an object modeling language argument term. The ArgN Expression has two operands. The first operand, Term 304, is a valid object modeling language term. The second operand, Term ArgNo 306, is an integer value which refers to the placement of the term argument to be returned. If Term ArgNo is set to one, ArgN returns the first argument in the term. If Term ArgNo is set to two, ArgN returns the second argument in the term. If Term ArgNo is set to zero, the functor of the term is returned. In the illustrated example the effect sets ?temp 308 to red.

Figure 34:
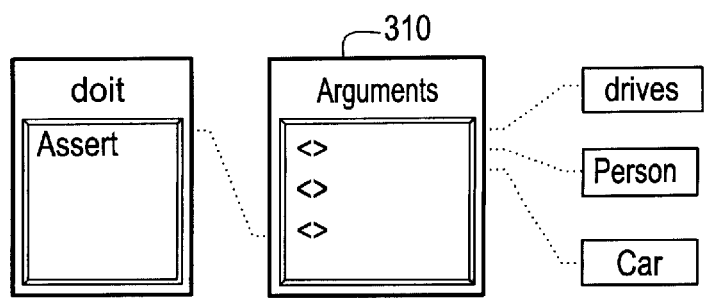

Referring to FIG. 34, the Arguments 310 expression is used to build an argument list to be used by a rule action and has at least two operands. In the illustrated example, an effect creating an association "Person drives Car" using an argument expression with three operands is shown.

Figure 35:
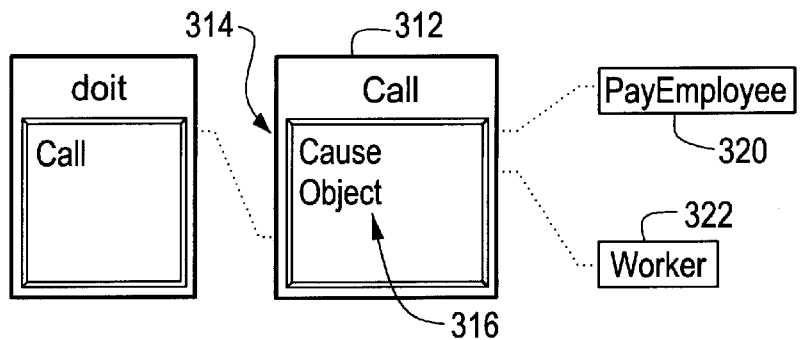
Figure 36:
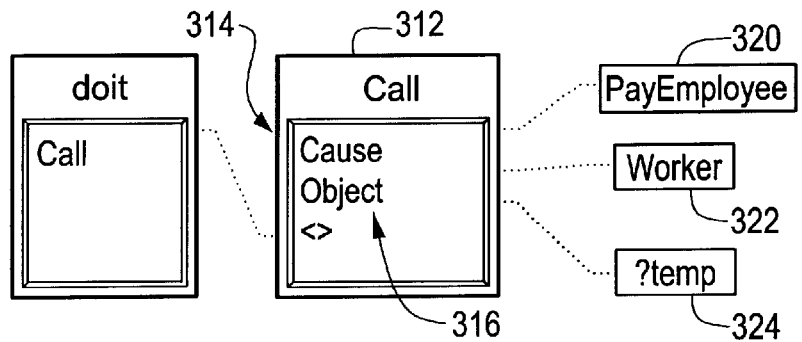

Referring to FIGS. 35 and 36, the Call 312 expression is used to define arguments for the Call 170 (FIG. 20) rule action. The Call expression has at least two operands. The first operand, Cause 314, specifies the name of the cause to be executed. The second operand, Object 316, specifies the name of the object to which the cause is bound. Any additional operands are parameters to the cause. In the example illustrated in FIG. 35, Call instructs the development tool to execute a cause named PayEmployee 320 that is bound to an object Worker 322.

Parameters may be added to cause calls by adding additional operands when creating the Call expression. In the example illustrated in FIG. 36, Call instructs the development tool to execute a cause that has one parameter that is named PayEmployee 320 and is bound to the object Worker 322. When the cause is executed, its parameter gets the value of ?temp 324.

Figure 37:
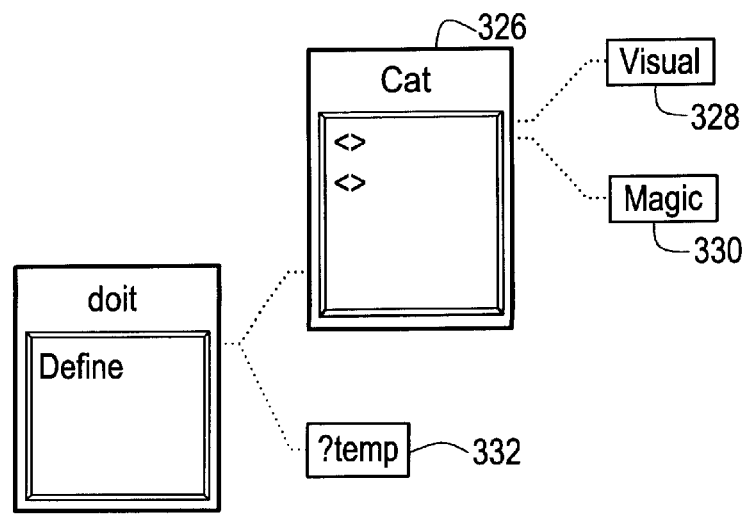

Referring to FIG. 37, Cat 326 allows concatenation of a series of strings. The Cat expression must have at least one operand, and the operands may be either text strings or XmString strings. Cat returns the concatenation of all the operands. Hence, the illustrated effect concatenates the strings Visual 328 and Magic 330, and ?temp 332 is set to "VisualMagic."

Figure 38:
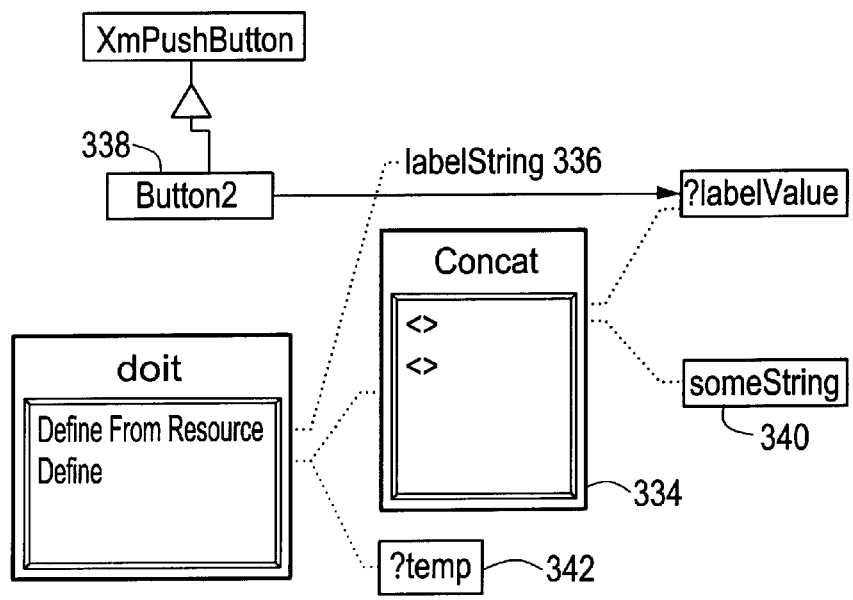

Referring to FIG. 38, Concat 334 allows concatenation of a series of strings. The Concat expression must have at least one operand, and operands may be either text strings or XmString strings. Concat returns the concatenation of all the operands. If all operands are text strings, the resultant string is also a text string. If one or more of the operands are XmStrings, all of the operands are converted to XmStrings and the resultant string is the concatenation of the operands. The illustrated effect concatenates the labelString 336 of Button2 338, which is an XmString, with the text string "somestring" 340. The variable ?temp 342 is set to the concatenation of the XmString representation of "Button2" with the XmString representation of "someString."

Figure 39:
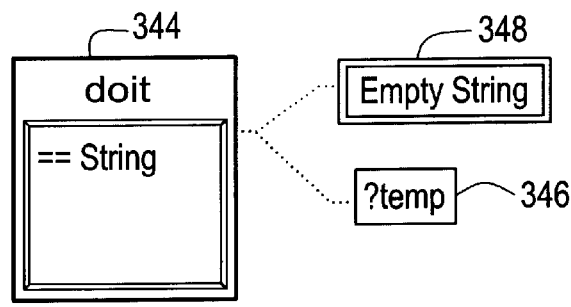

Referring to FIG. 39, Empty String 344 allows access to an empty string for use by certain expressions or rule actions. An empty string is a string that has no characters. The Empty String expression has no operands and returns an empty string as a result. The illustrated effect compares the value of ?temp 346 to an empty string 348.

Figure 40:
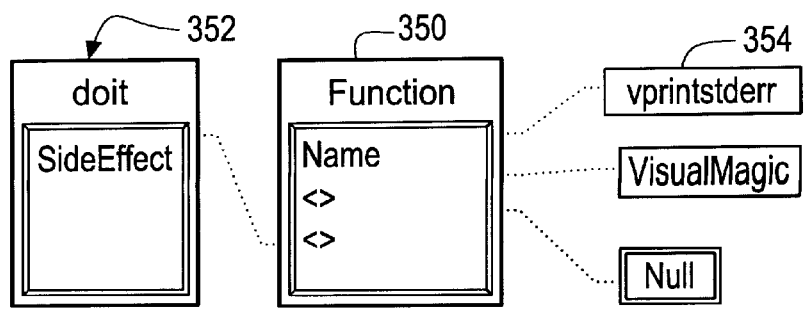

Referring to FIG. 40, Function 350 is used to define arguments for calling C++ functions external to the development tool. The Function expression has at least one operand, where the first operand specifies the name of the function and the subsequent operands are the parameters of the function. In the illustrated example, the Side Effect 352 rule action executes the vprintsderr 354 function to print the string "VisualMagic."

Figure 41:
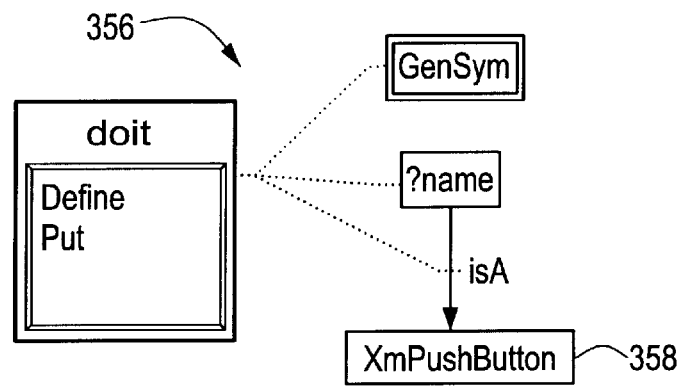

Referring to FIG. 41, GenSym 356 allows generation of a new symbol to be used by rule actions and other expressions. The GenSym expression is useful for generating a symbol name when the name is a "don't care." GenSym has no operands and returns a randomly generated symbol name as a result. The illustrated effect creates a new pushbutton by first generating a new symbol and then making the symbol an XmPushButton 358.

Figure 42:
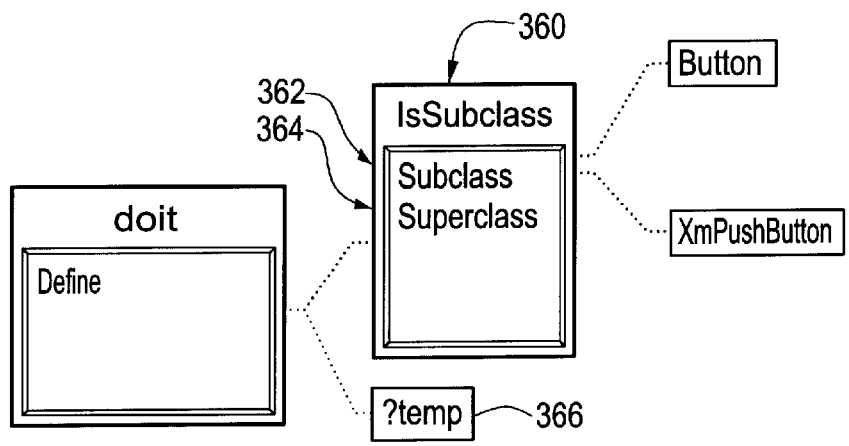

Referring to FIG. 42, IsSubclass 360 allows examination of two objects and determination of whether there is an inheritance relationship between those two objects. The IsSubClass expression has two operands, Subclass 362 and Superclass 364, and returns a Boolean value indicating whether the objects have the inheritance relationship. For example, given an object diagram that indicates that an object Button is a subclass of XmPushButton, then the illustrated doit effect sets ?temp 366 to TRUE. If Button was not a subclass of XmPushButton, ?temp would be set to FALSE.

Figure 43:
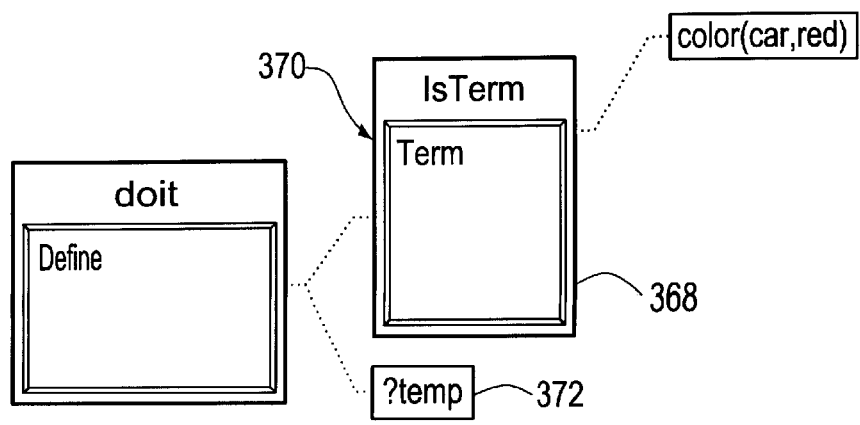

Referring to FIG. 43, IsTerm 368 allows examination of an argument to determine whether it is a valid object modeling language term. The IsTerm expression has one operand, Term 370, and returns a Boolean value indicating whether the argument is a valid term. IsTerm does not determine whether the term itself exists in the object modeling language, but rather whether the term is syntactically correct. In the illustrated example, ?temp 372 is set to TRUE since "color(car,red)" is a valid object modeling language ("OML") term. A valid OML term must be of the syntax: functor (arg1,arg2 . . . argn).

Referring to FIG. 44, the Newline 374 expression allows access to the ASCII newline character. The Newline expression has no operands and returns the value of newline. The illustrated example appends the newline character to the string SomeString 376.

Referring to FIG. 45, the Null 378 expression allows access to the value of NULL 380 for use by certain expressions or rule actions. NULL 380 is an entity which has no value. The Null expression has no operands and returns NULL as a result. The illustrated effect sets the value of ?temp 382 to NULL 380.

Referring to FIG. 46, the Parent 384 expression allows you to determine the name of the parent object of a widget object. The Parent expression has a single operand, Parent Of 386, and returns the name of the argument's parent. For example, given an object diagram having an object of XmPushButton type, Button1, and a child of an object of XmRowColumn type, RC, then the illustrated effect sets the value of ?temp 388 to RC.

Figure 48:
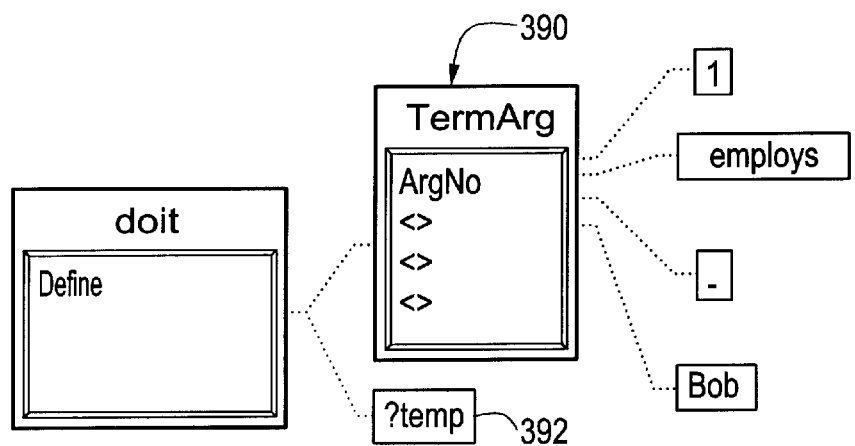

Referring to FIGS. 47 and 48, a TermArg 390 expression determines the value of an argument in an object modeling language term that exists in the current database. The TermArg expression allows a browser-type search from a rule diagram. The TermArg expression has at least three operands;, where the first operand, ArgNo, is an integer value which refers to the placement of the argument to be returned. From the list of operands, the expression builds an object modeling language term with the second operand being the functor of the term and the subsequent operands being the arguments of the term. The existing object modeling language is searched for the first matching term and the expression returns the value of the argument specified by ArgNo. ArgNo may not be greater than the arity of the object modeling language term. The same wildcards that are allowed in the browser may be used by the TermArg expression except that the second operand must be a functor, and cannot be a wildcard. For example, the illustrated associations are represented in the database with the terms "employs(Company,Bob)" and "employs(Company,Jim)." When the TermArg 390 effect in FIG. 48 is executed, ?result 392 gets the value Company 394, since ArgNo is "1." Setting ArgNo to "2" causes ?result 392 to get Bob 396.

Figure 49:
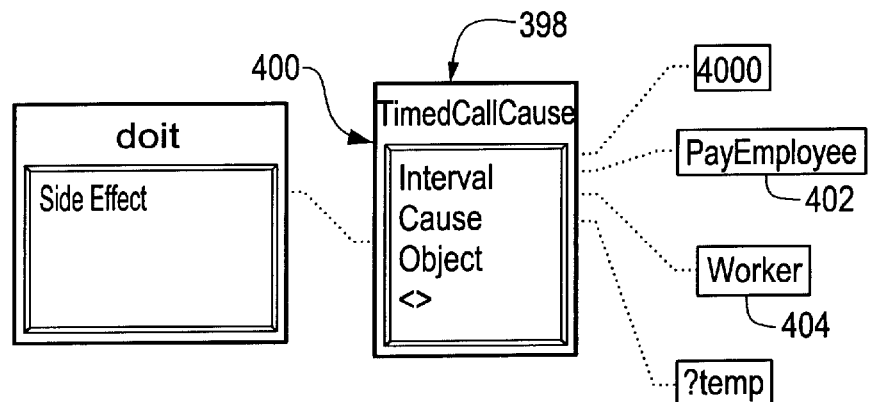

Referring to FIG. 49, TimedCallCause 398 behaves similarly to the Call 312 (FIG. 35) expression except that it allows addition of a delay before the cause is executed. The TimedCallCause expression has at least three operands. The first operand, Interval 400, specifies the number of milliseconds to wait before the call is executed. The other operands operate in substantially the same manner to those of the Call expression. The specifically illustrated rule action instructs the tool to wait 4000 milliseconds (4 seconds) and then attempt to execute a cause named PayEmployee 402 that has one parameter that is bound to the object Worker 404.

Figure 50A:
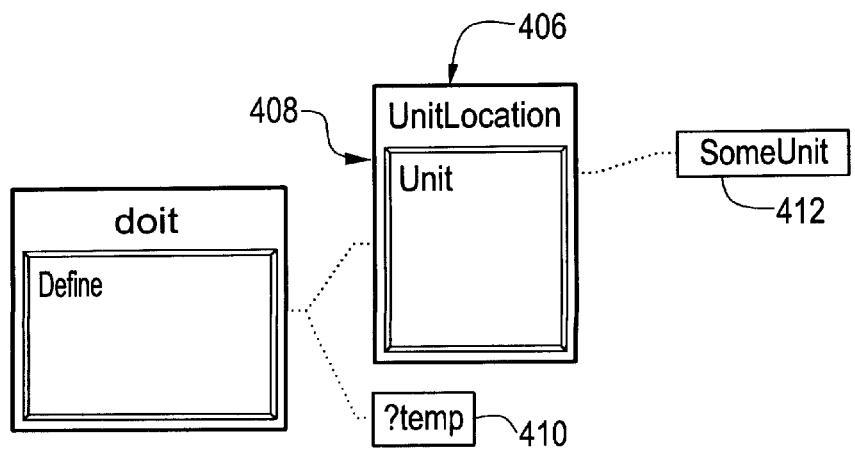

Referring to FIG. 50A, UnitLocation 406 determines the location of a specified unit. The UnitLocation expression has one operand, Unit 408, and returns the physical location of the unit as a string. The unit operand must be an existing unit. If the unit does not have a location, the value returned is NULL. In the illustrated example, the variable ?temp 410 is set to location of the unit SomeUnit 412.

Referring to FIG. 50B, expressions +414, −(not illustrated), *416, and /418 provide arithmetic computations. All four of the arithmetic expression have two operands. The operands must be of type integer. If not, they are truncated before arithmetic is performed, and if the result is not an integer, that result is also truncated. In the illustrated example, the variable ?result 420 is set to two.

FIGS. 51A and 51B illustrate models. A predefined object named model 700 is used to create a model. In particular, drawing an object, e.g., vehicle 702, as a subclass of model 700 makes that object (vehicle 702) and all of its elements and children part of the model. In addition to indicating that an object is a model, the elements and children associated with the model are described as model parts. A menu option "Model Of" is provided for this purpose, and operates to create a relationship between all of the objects in the diagram and the model object, the effect of which is identical to creating partof associations between each object and the model object.

The illustrated example is an object diagram showing parts of a vehicle 702. Because of the model definition, Car 704 and Truck 706 get the parts window 708, door 710, trunk 712, body 714 and wheel 716. The tool considers the parts of instantiations as objects with a special naming convention. The name of the object part contains the name of the instance followed by a dollar sign followed by the name of the part. For example, the window object that is part of the car object is referred to as the Car$Window object. If the object car had a subclass named SportsCar, then the window object for that instantiation would be SportsCar-$Car$Window.

Models are useful for creating a set of related objects from a single isA. Any object can be added or removed as a part of a model, and names of model parts used in rules will resolve to the corresponding part of a given model instance. Further, changes to models are reflected in the model instances.

Special predicates are employed in the object modeling language for model implementation. The predicate partOf (p,m) indicates that p is a part of a model of m. The predicate hasPart(m,p) indicates that model m has a part p, which is asserted automatically by the assertion interpreter. The predicate relationNotInstantiated(f) prevents terms with the functor f from being created for model instantiation. The predicate entityRelation (eR) indicates if eR(A,B), where A and B are both model parts of a model m, then the model instance eR(mi$A,mi$B) is created, where mi is a model instance of model m. Without entityRelation(eR) the term created would be eR(mi$A,B). The substitution of model parts in terms is performed for terms having arity >2, regardless of whether entityRelation is asserted. The predicate generates(p,R) for model p calls rule R on p when the model is instantiated.

Having described the behavior of various graphic tools, translation of diagrams, execution of object modeling language code and production of source code will now be described.

Figure 52:
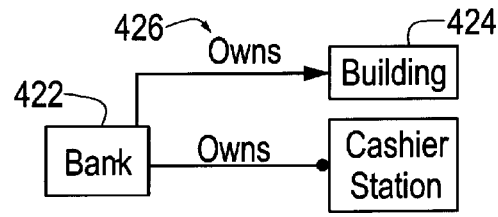
FIGS. 52–54 illustrate object diagrams and corresponding modeling language code.
Figure 53:
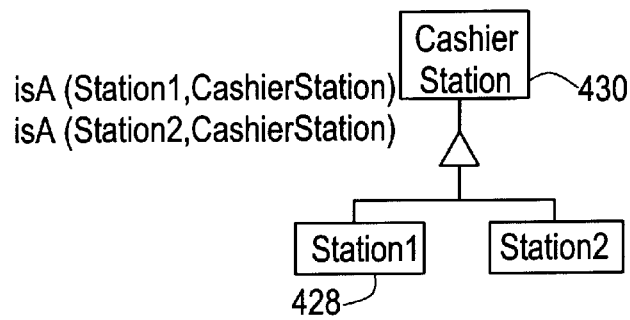

Object diagrams and corresponding object modeling language syntax are illustrated in FIGS. 52 and 53. The general syntax of the object modeling language is as follows: Term::=Functor '('{Entity,}Entity ')', where the functor is an association name and an entity is any sequence of characters, including blank. The comma, backslash, and left and right parenthesis are given special significance. The first character following an unnested "(" or "," starts a new entity. The character preceding an unnested "," or ")" is the last character of an entity. Hence, the graphically represented association between Bank 422 and Building 424 is represented in the object modeling language by the line: Owns (Bank, Building). Similarly, the association between Station1 428 and Cashier Station 430 is represented as: isA (Station1, CashierStation)

In the object modeling language every object is a class. However, such classes may have values for their attributes. These attribute values can be inherited to subclasses upon request. The object modeling language represents associations as a logical relationship that can be traversed in any direction. For example, given that Owns 426 is an association involving Bank 422 and Building 424, the position of each class in the association indicates a specific role. It is therefore possible to determine what a given Bank owns, who a given Building is owned by, all the Banks that own at least one building, and all the buildings that are not owned.

Figure 54:
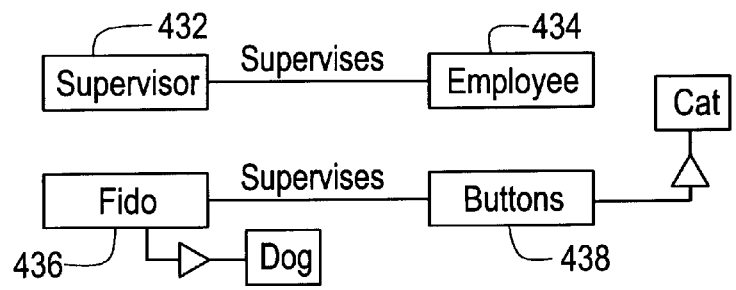

Referring to FIG. 54, while the object modeling language does not require rigid typing, a representation of typing is supported for the purposes of generating source code in languages which rely on typing. In general, any class may be associated with any other class in a given association, regardless of type. For example, given that supervisor 432 supervises employee 434, it is possible to make an association Fido 436 supervises Buttons 438, where Fido is a Dog (and not a supervisor), and Buttons is a Cat (and not an Employee). However, all of the information needed to describe typing can be represented and a specific object modeling language program can be written that enforces a specific kind of typing. For example, it is possible to cause all new occurrences of supervises to involve a subclass of Supervisor and Employee in that order.

Generalization and Aggregation are modeled by associations. Generalization is modeled by associations with the predefined functor name isA. Saying Fido isA Dog indicates that Fido is a specialization of a Dog, i.e., has a superclass Dog. Multiple inheritance can be represented by specifying more than one isA for a given object. Aggregation is modeled by associations with the predefined functor name partOf.

Attributes are modeled as binary associations. In the object modeling language there is no difference between an attribute and a binary association. The statement Supervisor supervises Employee corresponds to an attribute supervises on the object Supervisor with value Employee. The term attribute in the object modeling language is usually reserved for functors that are single-valued for a given object. In the overall tool, the type is specified by predefined associations viMHasAttr(Object, Attribute, Type) or viMIsAssoc(object, Association, Type).

Figure 55:
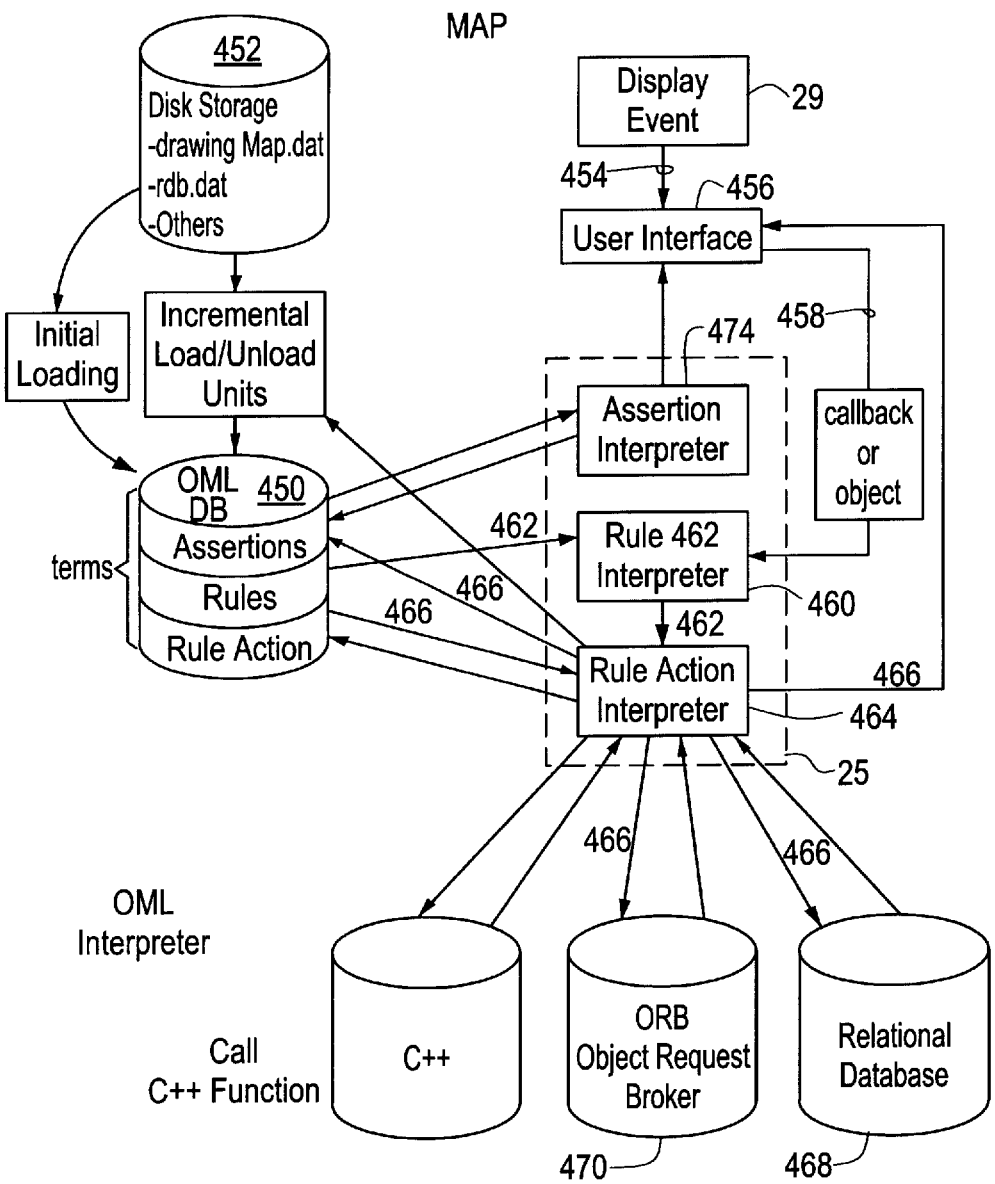
FIG. 55 illustrates operation of the interpreter and map.

Referring to FIGS. 1 and 55, the information represented in the object modeling language is interpreted by the interpreter 25. The interpreter analyzes an OML database 450, which is created by loading in units of OML code from disk storage 452. The interpreter performs various actions associated with the meaning of the object models, including building additional objects (such as user interface and database objects), and executing rules and expressions. The execution is based on the current set of associations in the OML database 450. The order of occurrence of associations in the OML database is largely immaterial except for cause alternatives and effects which are executed in the order that they occur.

Events enter the map at point 454 from the user's display 29 and are processed by a user interface 456, resulting in callbacks. At 458, callbacks can result in invocation of a rule. This is determined by whether there is an assertion of the form CallbackName(Obj,EffectName). If there is such an assertion, then the Rule Interpreter 460 is invoked with rule CallbackName on object Obj. At points 462 the Rule Interpreter steps through the rule and calls the Rule Action Interpreter 464 to perform each action of the rule. At points 466 the results of the Rule Action Interpreter 464 may depend on the state of the OML database 450, the Relational Database 468, or the Corba object request broker ("ORB") 470. Results of the Rule Action Interpreter include adding new assertions, making modifications to the User Interface, accessing or modifying the Relational Database, or interfacing with the ORB. The Assertion Interpreter 474 is invoked any time the OML database changes. The assertion interpreter examines the changed terms and performs some action based thereon. The action may result in further changes to the OML database 450 or changes to the User Interface 456.

FIG. 56 and Appendices A, B, C and D, which are incorporated by reference, illustrate operation of the assertion interpreter 474. When a term 476 enters the assertion interpreter, the term is selected based upon the functor of the term. The term may be loaded, asserted by a rule or asserted by the interpreter itself.

In the case of an isA selection 478, the assertion interpreter will declassify the entity if the entity is already a widget (UI object), and set a new widget class. The assertion interpreter will get the applicable model (outermost subclass of the model), and if not already instantiated it will instantiate and resolve the model and subclasses. Given a model instance (whole) and a model (applicable model), for each part p of the model, a new entity whole$p is created and isA(Whole$p,p) and partOf(p,whole$p) are asserted. Further, (p,whole$p) is added to the resolved model parts map; for each part p for each term with p as the first argument, a new term is created as follows: substitute for each q where q is part of whole resolvedModelParts(q).

In the case of a widget-child relation 480, e.g., isIn, a parent may be set for WInstance, the data structure for storing user-interface object information. In the case of a widget-sibling relation 482, the assertion interpreter sets a resource value in WInstance. In the case of widget resource 484, the assertion interpreter sets a resource value in WInstance. In the case of generates 486, the assertion interpreter adds the term to the generates list, i.e., to the list of generates entities. For each element e of generates the entity list, if generates (e,R), rule R is called on e. In the case of loadedfrom 488, the OML unit is loaded. In the case of partof 490, hasPart is asserted. More particularly, whenever a part is added it becomes necessary to reinstantiate the model. This includes deleting model instantiations and instantiating and resolving model subclasses. A recreate 492 rule action may be invoked to propagate widget parents, process generates list, create widgets and set widget values.

When a term is removed, a notification is provided to the assertion interpreter. In response to the notification the assertion interpreter removes the term and retracts derived information associated therewith at 494 such that the meaning of the diagrams is updated.

Figure 60:
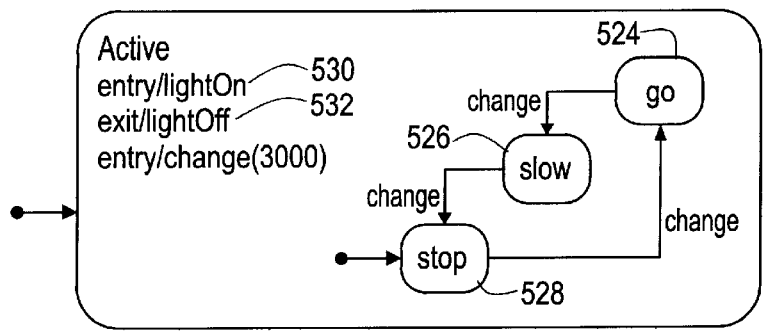
FIG. 60 is a state diagram associated with the example program.
Figure 61:
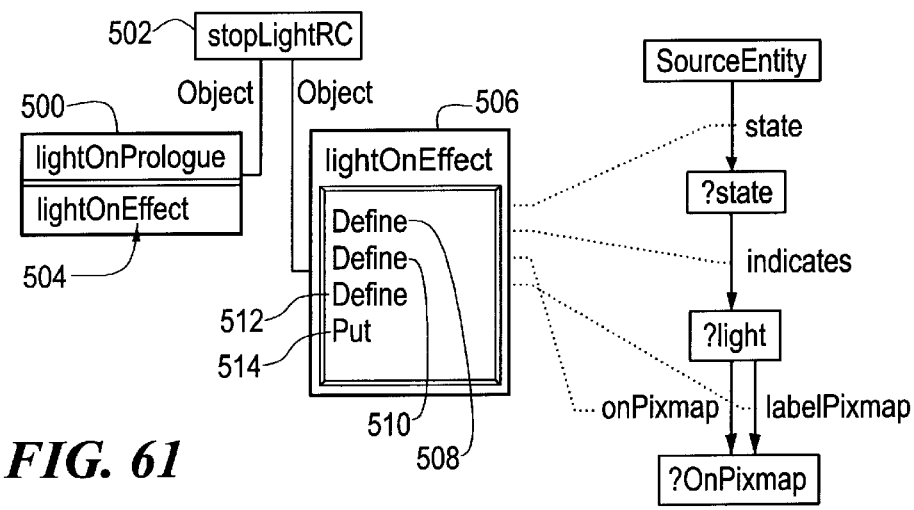
FIGS. 61 and 62 are rule diagrams associated with the example program.
Figure 62:
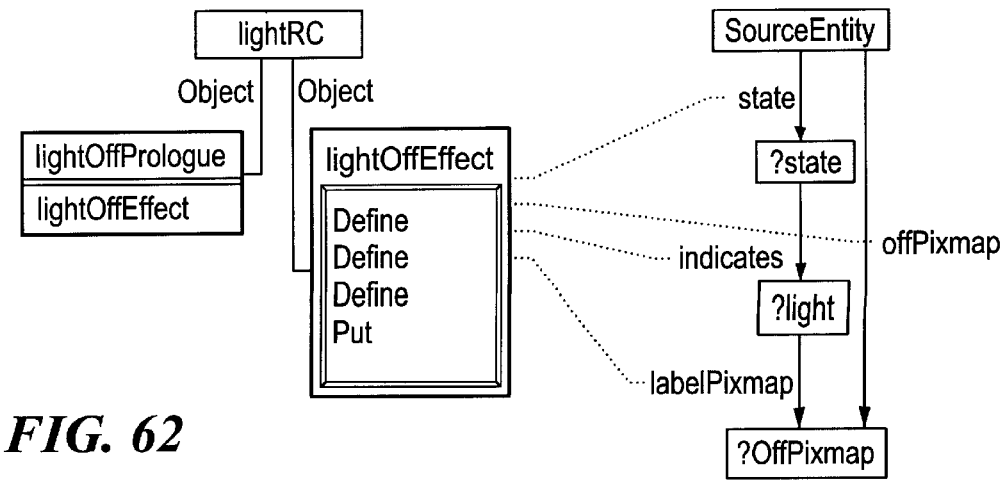
Figure 66:
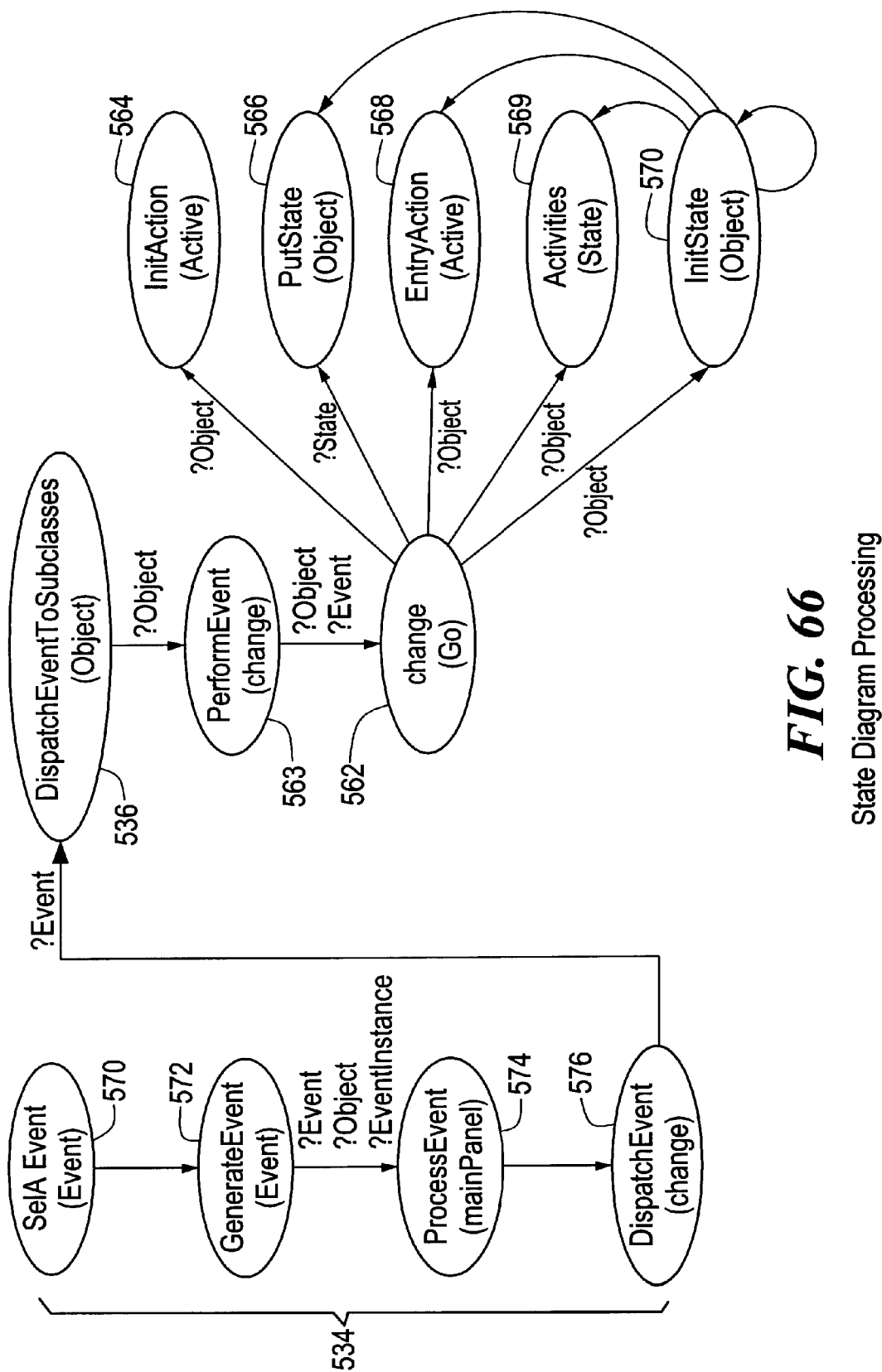
FIG. 66 is a flow diagram which illustrates processing of state diagrams.

FIGS. 57–62 illustrate a diagrammatical representation of a program for running a traffic stop light utilizing the tools described above. In particular, FIG. 57 is a user interface diagram, FIGS. 58 and 59 are event diagrams, FIG. 60 is a state diagram, and FIGS. 61 and 62 are rule diagrams. Translation of rule diagrams and state diagrams to object modeling language code will be described with respect to the stop light diagrams.

The Rule interpreter 460 (FIG. 55) and Rule Action interpreter 464 (FIG. 55) provide object modeling language code which corresponds to the rule diagrams. For example, the rule diagram of FIG. 61 is translated to object modeling language code illustrated in FIG. 63. The cause 500 LightOnPrologue associated with the object 502 StopLightRC and having a cause 504 LightOn is translated to: LightOnPrologue(stoplightRC,LightOn). The effect 506 translates to several lines of object modeling language code wherein rule actions 508, 510, 512, 514 correspond to lines 516, 518, 520, 522, respectively.

Referring to FIGS. 60, 64 and 65, the stoplight has three states, go 524, slow 526 and stop 528, which are indicated by the color of the light turned on. The actions of turning each light on and off, lightOn 530 and lightOff 532, are substantially similar and hence are described for the general class of lights lightRC. Inheritance is then used to apply the rules to each of the respective lights.

The object modeling language code generated from the state diagram includes predefined sections 534 which facilitate operation of code sections generated specifically from the state diagram. Within the predefined sections @Fn indicates a function, @E indicates an object, ? indicates a variable and @GenSym creates a new symbol. @A indicates getAttr(Entity(E), Functor(F)), which returns the second argument (where underscored) of the form: F(E,_). @AI functions in the same manner as @A except that the corresponding search runs throughout the inheritance hierarchy.

Predicates 537 are provided which describe the basic structure of the state diagram. The line isStateOf(Go, StopLightRC) 538 indicates that Go is a state of StopLightRC. Lines 540 describe each transition, including the origin state 542, the destination state 544, the transition event 546, and associated condition 548 and action 550. Line 552 indicates that the number of transitions on change for stoplight is three. Lines 554 indicate the initial state within each state in the hierarchy, as indicated by lines 556.

Referring now to FIGS. 60, 64, 65 and 66, five steps are executed as defined in the predefined sections 534: sendEvent 570, generateEvent 572, processEvent 574, dispatchEvent 576 and dispatchEventToSubclasses 536.

When generating the object modeling language rules specific to the diagram three types of inheritance are provided: object inheritance, state inheritance and event inheritance. Iterators are employed to provide the specified inheritances. Object inheritance is initially provided by employing an iterator in the predefined section 534 at line 536. Event inheritance is then provided at line 558, and state inheritance is provided starting at line 560 in the change rule 562.

The change rule 562 describes program operation upon the change transition. Exitactions 564, are executed, followed by putState 566, EntryActions 568, activities 569 and initState 570. When transitioning from the state go to the state slow in the present example, exit actions on state go are performed at 564. The present state, go, is then changed to the new state, slow, at 566. Entry actions are then performed on the new state, slow, at 568. Activities such as "do" actions are then performed on the new state at 569. Finally, the new state is initialized at 570 (for example, if the contour has changed then there may be actions to be performed).

Chaining 572 is a predefined predicate which is employed to control multiple rules in the inheritance hierarchy. Three modes of chaining are provided. "Override" finds the innermost rule. Override is the default mode for chaining. "SubToSuper" performs all of the rules in that order. "SuperToSub" performs all of the rules in the that order. A fourth mode inhibits chaining.

Referring again to FIG. 1, as described above, the object modeling language 24 does not rely on typing. However, it is envisioned that the source code 28 generated from the object modeling language may require typing, e.g., C++ will so require. Hence, special predicates are employed to provide the generator 31 with a basis for determining typing in the source code.

Figure 67:
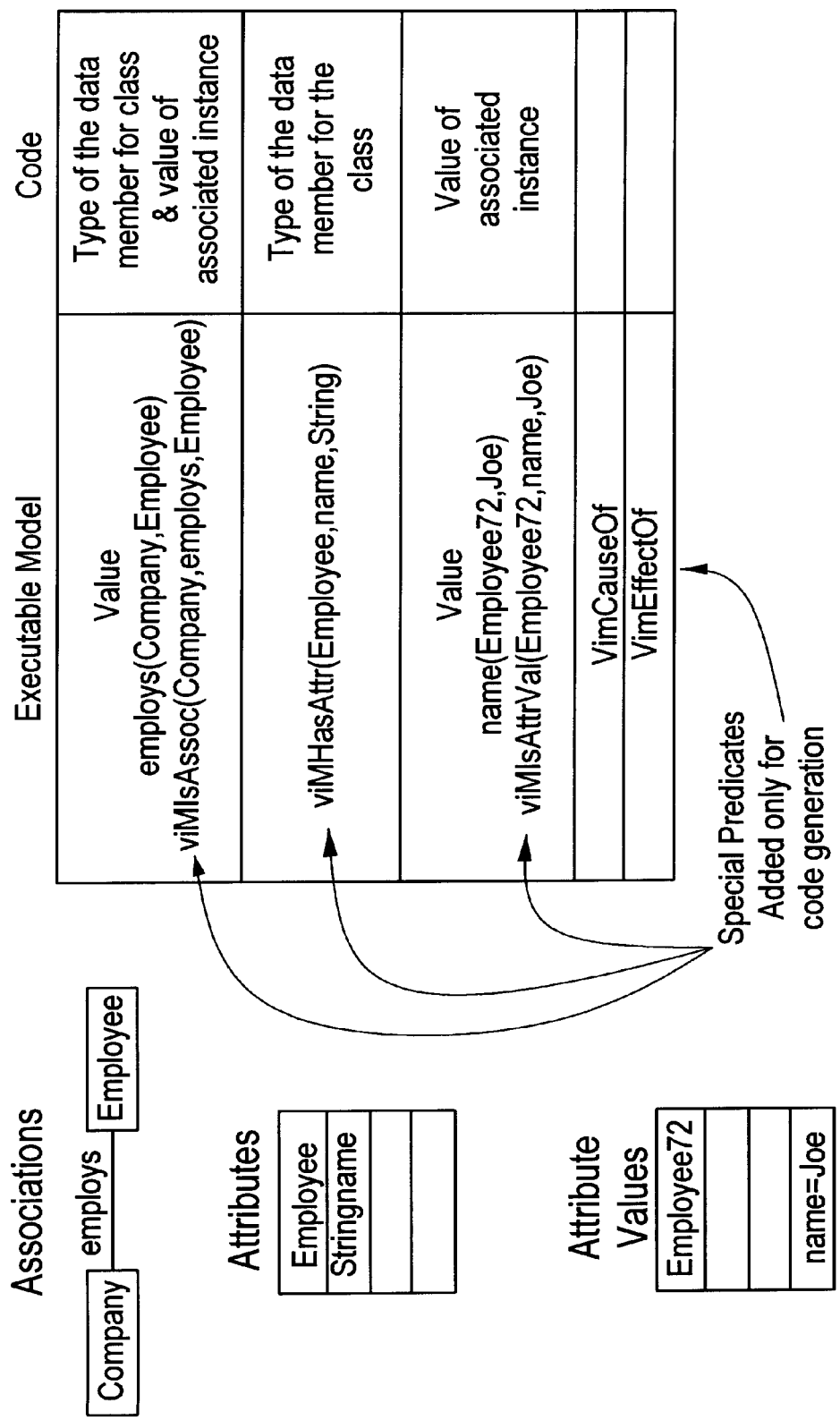
FIG. 67 illustrates special predicates which are employed to accommodate typing requirements for source code generation.

FIG. 67 illustrates special predicates implemented in the executable model represented in the object modeling language and corresponding C++ requirements for associations, attributes and attribute values. For example, for the association company employs employee, the executable model employs the representation "employs(Company, Employee)." The special predicate ViMIsAssoc(Company, employs, Employee) is added to the executable model to allow typing of the data member for the calls and value of the associated instance. The special predicate ViMHasAttr(Employee, name,string) is added for the attribute to allow typing of the data member for the class. For the illustrated attribute value the object modeling language will include the term "name (Employee72,Joe)." The special predicate ViMIsAttrValue is added for code generation to represent the value of the associated instance. Other special predicates include ViMEffectOf, ViMCauseOf and ViMPlannedIsA. Each special predicate is effective only within the object modeling language code describing a single diagram, and hence each diagram is a scope. Predefined types, such as integer and string, are also provided for convenience. Use of special predicates in connection with the stoplight example are illustrated in Appendix E.

Figure 68A:
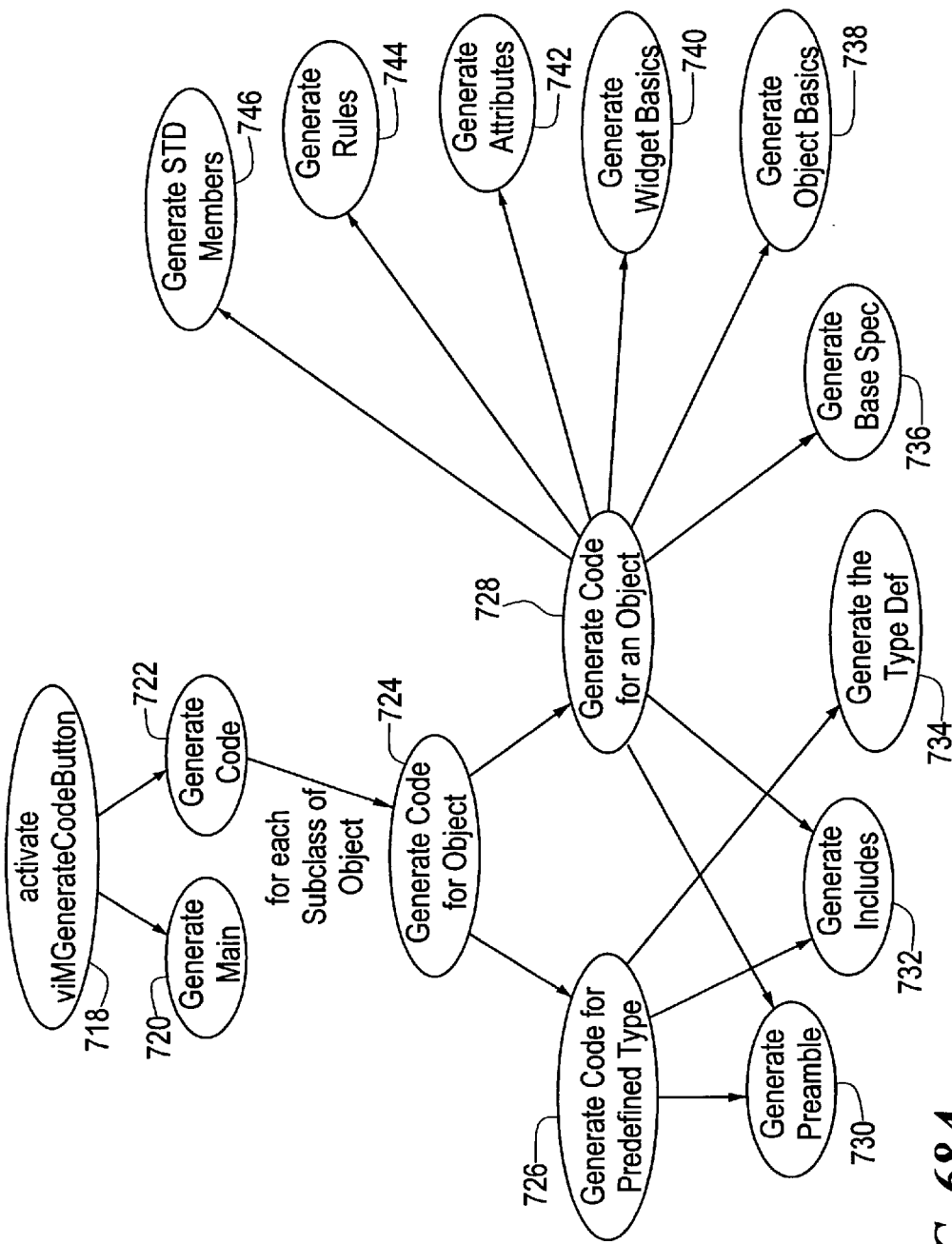
FIGS. 68A–68D illustrate source code generation.

FIG. 68A illustrates source code generation. Code generation is broken down into tasks including activate viM-GenerateCodeButton 718, generate main 720, generate code 722, generate code for object 724, generate code for predefined type 726, generate code for an object 728, generate preamble 730, generate includes 732, generate type defs 734, generate base spec 736, generate object basics 738, generate widget basics 740, generate attributes 742, generate rules 744 and generate STD members 746.

The generate includes 732 task involves determine includes tasks such as for base classes, attributes, rules, states of the object, std objects and timers, and generate includes tasks such as library include, predefined include regular include, predefined include for body, include for body, include for widget, class declarations and library include for body. The generate Base Spec 736 task includes generating a base specifier for each superclass (isA) Generate object basics 738 includes generating constructors, a make function (makes an archetype instance), an init function (initializes archetype instance) and archetype definition. Generate widget basics 740 includes generating widget class members, a create widget function, a make widget function, generating args (widget resource settings) and a make addcallbacks tasks. Generate attributes 742 includes a generate attribute task for each viMIsAssoc and viMHasAttr operative to generate an attribute data member and get and put functions depending upon: 1) overloaded or non-overloaded, 2) predetermined type or not, and 3) multiplicity one or many. Generate STD members 746 includes a generate STD members for state task (transitions, actions), a generate STD members for event task (dispatch event, perform event and send), and a generate STD members for object with state task (set state attribute, and instance set for dispatch, i.e., add to set for each instance).

Figure 68B:
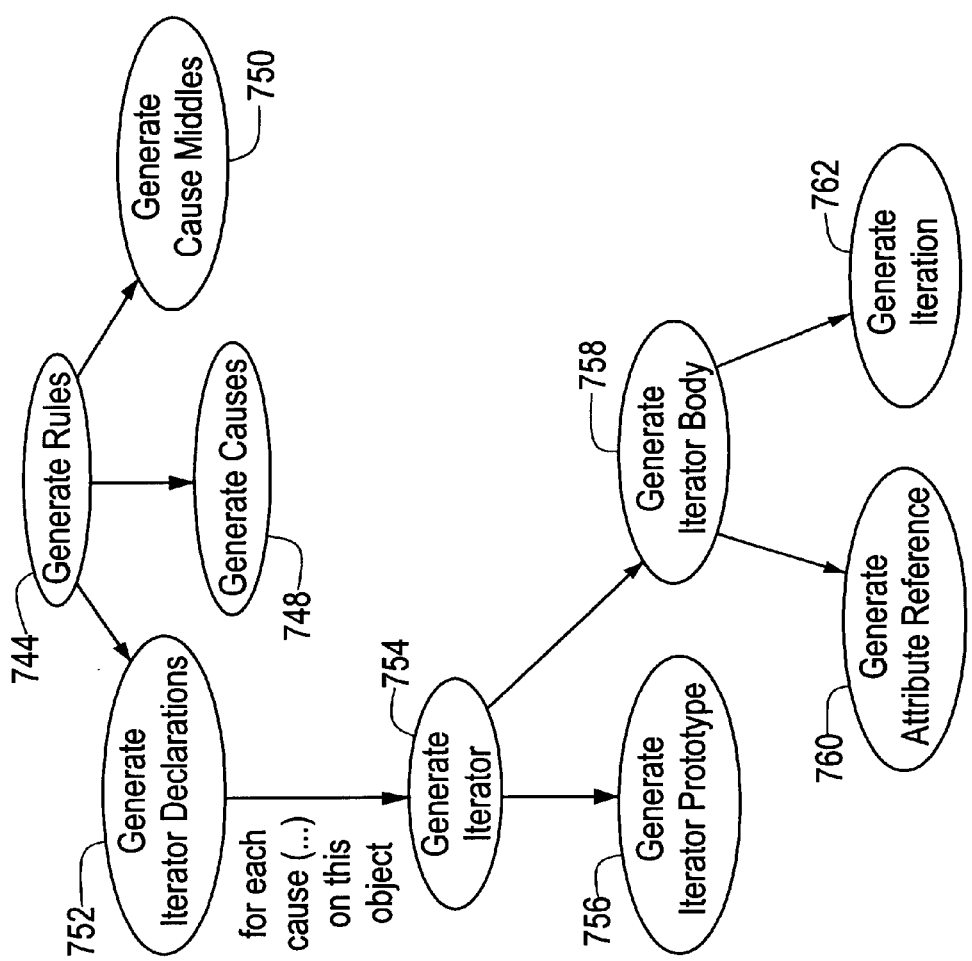

Referring to FIGS. 68A and 68B, generate rules 744 includes generating causes 748, generating cause middles 750 and generating iterator declarations 752. In particular, a generate iterator 754 task is executed for each cause( . . . ) on the object, including generating an iterator prototype 756 and generating an iterator body 758. Generate iterator body includes the tasks generate attribute reference 760 and generate iteration 762.

Figure 68C:
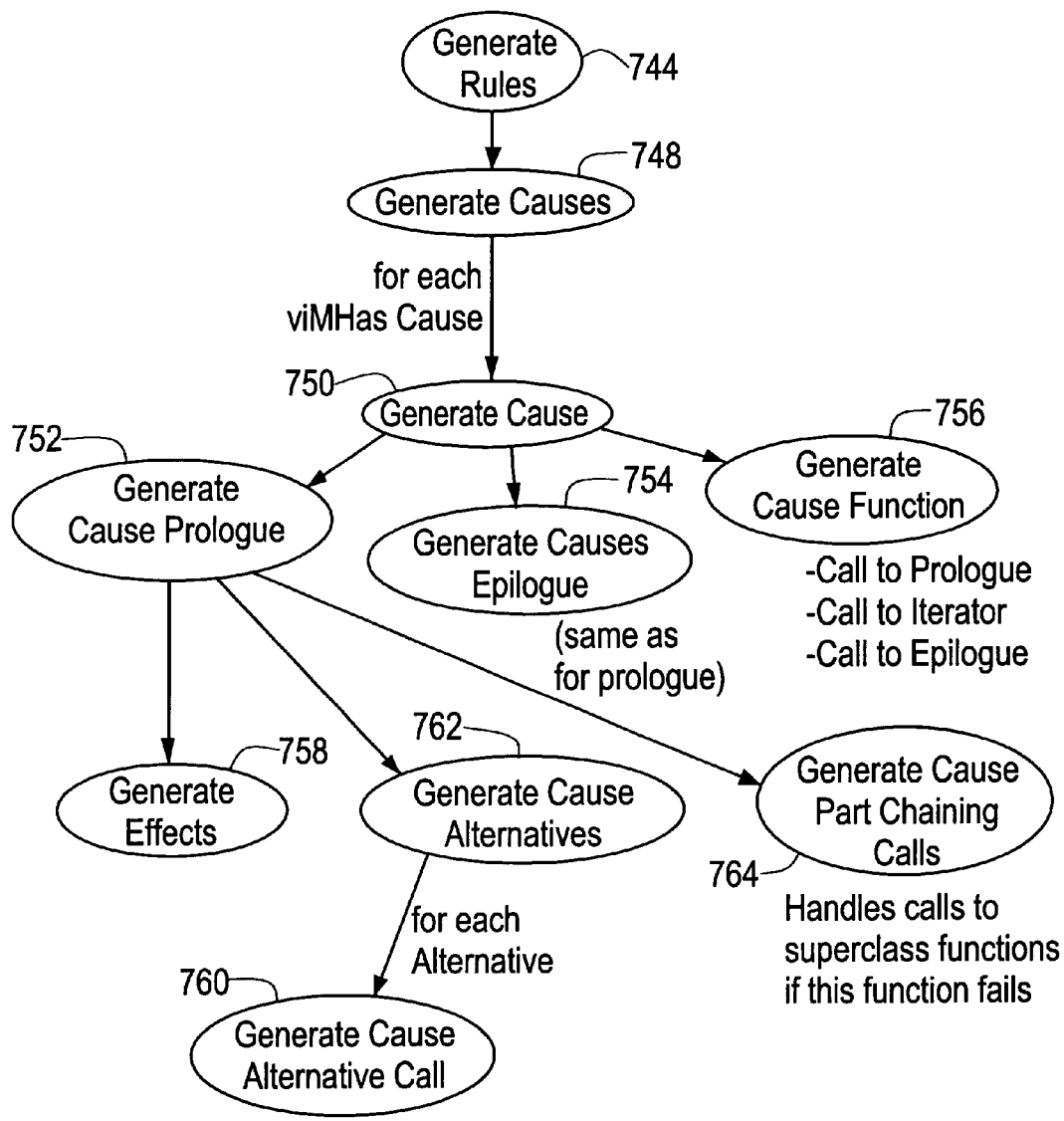

Referring to FIGS. 68B and 68C, generate cause 748 includes executing generate cause 750 for each viMHasCause, including a generate cause prologue 752 task, a generate cause epilogue 754 task and a generate cause function 756 task. Generate cause function 756 includes calls to prologue, iterator and epilogue. Generate cause prologue 752 includes generating effects 758, generating cause alternative calls 760 for each alternative to generate cause alternatives 762 and generating cause part chaining calls 764, which handles calls to superclass functions if this function fails.

Figure 68D:
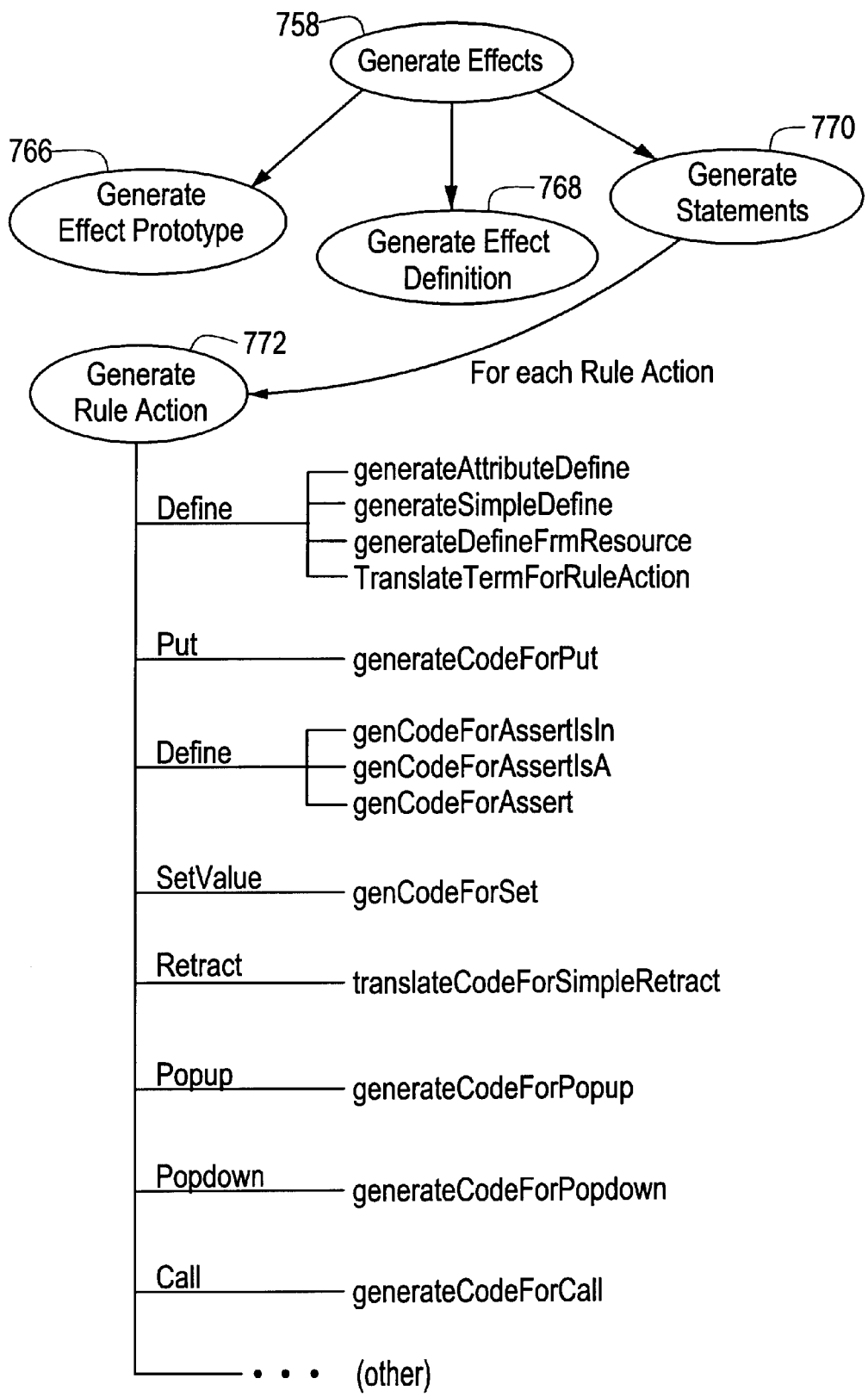

Referring to FIGS. 68C and 68D, generate effects 758 includes a generate effect prototype 766 task, a generate effect definition 768 task and a generate statements 770 task. There is a generate rule action 772 task for each type of rule action. For define the task includes generate attribute define, generate simple define, generate define from resource and translate term for rule action. Translate term for rule action includes translating the term and translating the term type, which generates code for any term. One pass produces temporary variable declarations when needed. A second pass generates expression code. A syntax only pass parses the structure.

Figure 69:
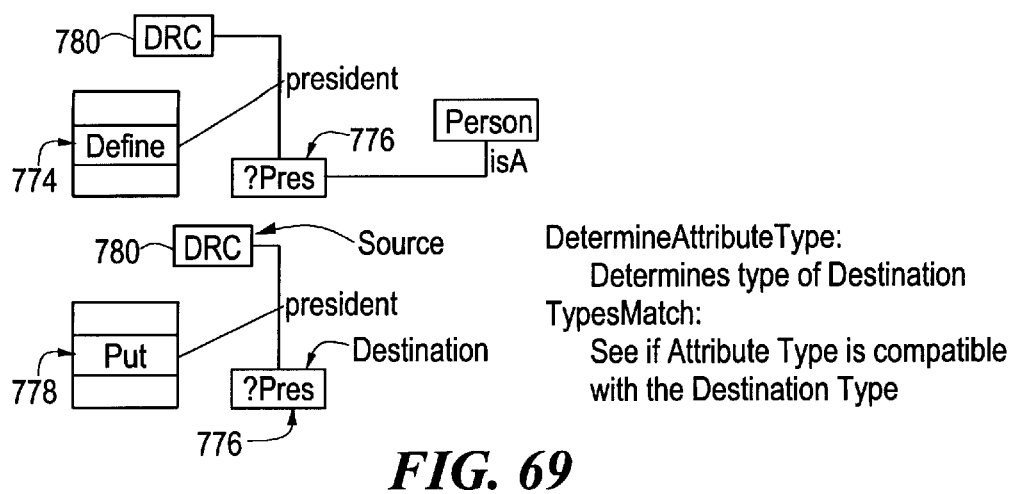
FIG. 69 illustrates type matching.

Referring to FIG. 69 and Appendix F which is incorporated herein by reference, Define 774 is used to "get value" for the variable ?Pres 776. Put 778 is used to "put value" by asserting that ?Pres 776 is president of DRC 780. A Routine is provided for determining attribute types. For a known destination type, DetermineAttributeType determines if the types are compatible, verifies consistency, finds the innermost attribute, and performs an ambiguity analysis to determine whether there is a match with the destination type. For an unknown destination type the process is similar, however for variables without a plannedIsA the type is null. For predefined types, if the attribute is hierarchically based on the same type then compatibility exists.

The tool contains a feature that allows direct modification of the source code. Further, such source code modifications may be preserved even when the diagrams are modified. This feature is useful when the user makes changes to the model and subsequently wishes to re-generate files without overwriting the old files and eliminating the changes. The process outlined below automates matching the newly-generated files with directly implemented source code changes.

In a first step a set of named text-substitution macros is defined to create files. These macros contain text to be copied to the output file literally. They may also contain special commands to insert a variable or a date or something similar. The following is an example from a macro file. OverloadedAttributeGetMemberPrototype. virtual void get_the_$var(Attribute) ($var(AttributeType)* &$var (AttributeType)_).

Executing the macro OverloadAttributeGetMember-Prototype when Attribute has value attr and Attribute Type has value int, the output file will then contain the text virtual void get_the_attr(int* &int_);

The program generating the file will call functions to set variable values and execute macros. Each time a macro is executed, the current values of any variables in the macros is determined, and then the contents of the macro are 'output.' Internally, nothing is output until all of the macros for the file have been executed. Instead, a list of commands is created which provide the file when executed.

While creating the file, sufficient information is saved to enable re-creation of this file independently of the program used to create it. This information includes the text of all macros, the names of the particular macros executed to create the file, and the variable values at the time the macros are executed.

The second step involves file reconciliation. Once the user has changed the original file, the original file is recreated in a private directory. The saved file of full macro text is initially read in. The macros in this saved file are potentially different form the current (new) set of macros, and hence this saved file is employed to generate the original file. While reading the saved file a list of commands essentially identical to the list of commands originally used to create it is built. As part of this processing, the range of line numbers in the file generated by each macro is tracked. The commands required to create the old file are then processed.

Once the old file is created, a diff program is employed to compare the two files (old and new). Diff is invoked in a way that outputs the difference sections as either change records, add records, or delete records. The line number range generated by the diff program is then used to determine which macro was used to generate the affected text. This information is used to create an override file associated with the data file created in the first part. This file consists of the names of macros executed as well as add or change records.

Beginning at the start of the file, the name of each macro executed is output. Upon reaching a macro execution that contains lines that were changed by the user (as determined by looking at the line numbers generated by diff), an add or change record is output depending on whether diff has identified an addition or change. An add record consists of the text to be added and the line number relative to the start of the macro execution where the text is to be added. A change record consists only of the text to be substituted for the original text of the macro.

This information is then saved in the override file for processing in the next step, creating the modified file. The processing in this step is substantially similar to the first step. The difference is, if an override file (as described in the second step) is available, the information from the override file is merged into the command list created in this step. As before, the program generating the file will call functions to set variable values and execute macros. It is not necessary that the macros called or variable values be exactly the same as they were in the first step. Also as before, a list of commands that we will execute to create the file is created. In the absence of an override file, this will all proceed as in the first step.

If an override file is present, this file will be processed after the list of commands is complete. This process takes the two lists of commands, the commands from the program and the commands form the override file, and merges them into a final list of commands that is then process to generate the resulting file.

In the simplest case the user will have made no substantive changes to the model. In this case, the list of macros is exactly the same for the original file and the override file. Creating the re-integrated file would then be as simple as stepping through the list of macros and outputting either the original text with possible additions or the replaced override text.

In a more complex case, however, there will be changes to the model and thus to the macro lists. Merging the two command lists will consequently be more difficult. To handle this, two new files are initially created, each containing just the macro commands from either the current version of the model or from the override data file. These two files are then passed to the diff program which is invoked in a way that will generate a side-by-side diff.

The task is to take:
A—The command list containing commands to generate the output file corresponding to the current model (generated in step 3);
B—The command list containing override commands generated in step 2;
C—the side-by-side diff output comparing the macro lists form A and B; and generate
D—the final command list used to generate the re-integrated file.

In the side-by-side diff output, the left column represents the macros in list A and the right side represents the macros in list B. This output is processed electronically be the program to generate list D and then the final output file.

If there is text in the left column, it represents a macro that is found in list A. All commands are copied from list A related to that macro (including any variable values but excluding the macro command itself). Then, the right hand column is scanned for text. The diff output contains a character telling how the left and right hand columns compare.

If this character is a '<', there is nothing in the right hand side. This means that the macro from list A (and C) is a new one and not found in list B. Hence, the method proceeds on to the next entry in list A (and C).

If this character is a '\' or '>', the macro in list B does not match the macro in list A. This indicates a change to the model where potential modifications the user made no longer apply (because something has been deleted). Hence whatever was in list B at this point is disregarded.

Otherwise, the two macro names match. If there are any non-macro commands in list B at this point (add or change commands), they are copied to list D, the output list.

Next, the macro name command is output from list A to list D. Finally, if there is nothing in the left column, this indicates that the current model has been changed so that whatever was in list B no longer applies. This macro can be disregarded.

When this operation is complete, a list D which contains all the macro commands as well as all the related data commands (variable values and override add and change commands) is provided. The final step is to process this list of commands to generate the re-integrated output file.

Figure 70:
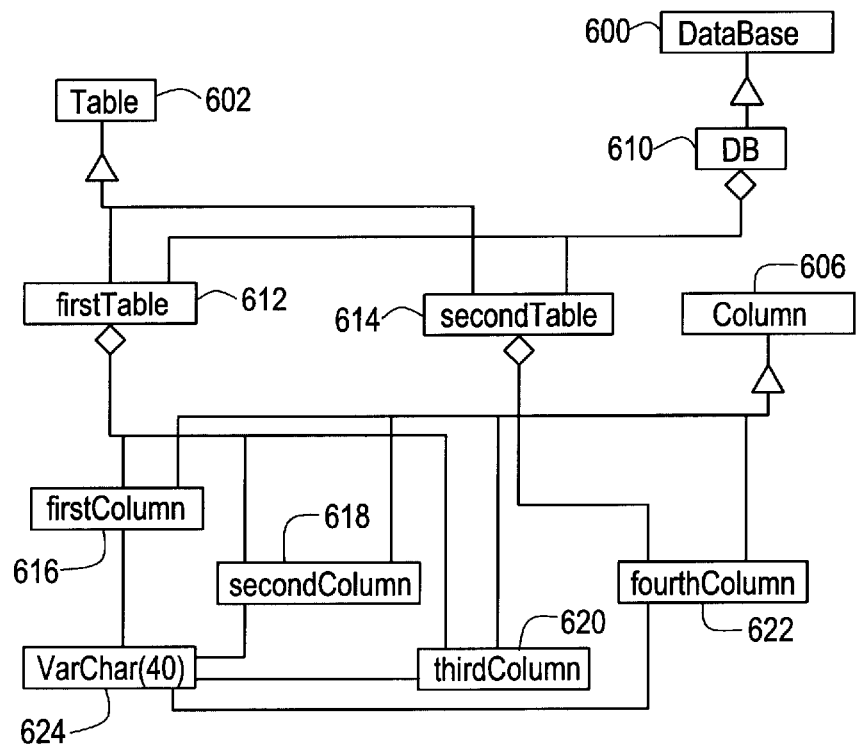
FIG. 70 illustrates generation of a relational database table using SQL statements created from an object diagram.
Figure 71:
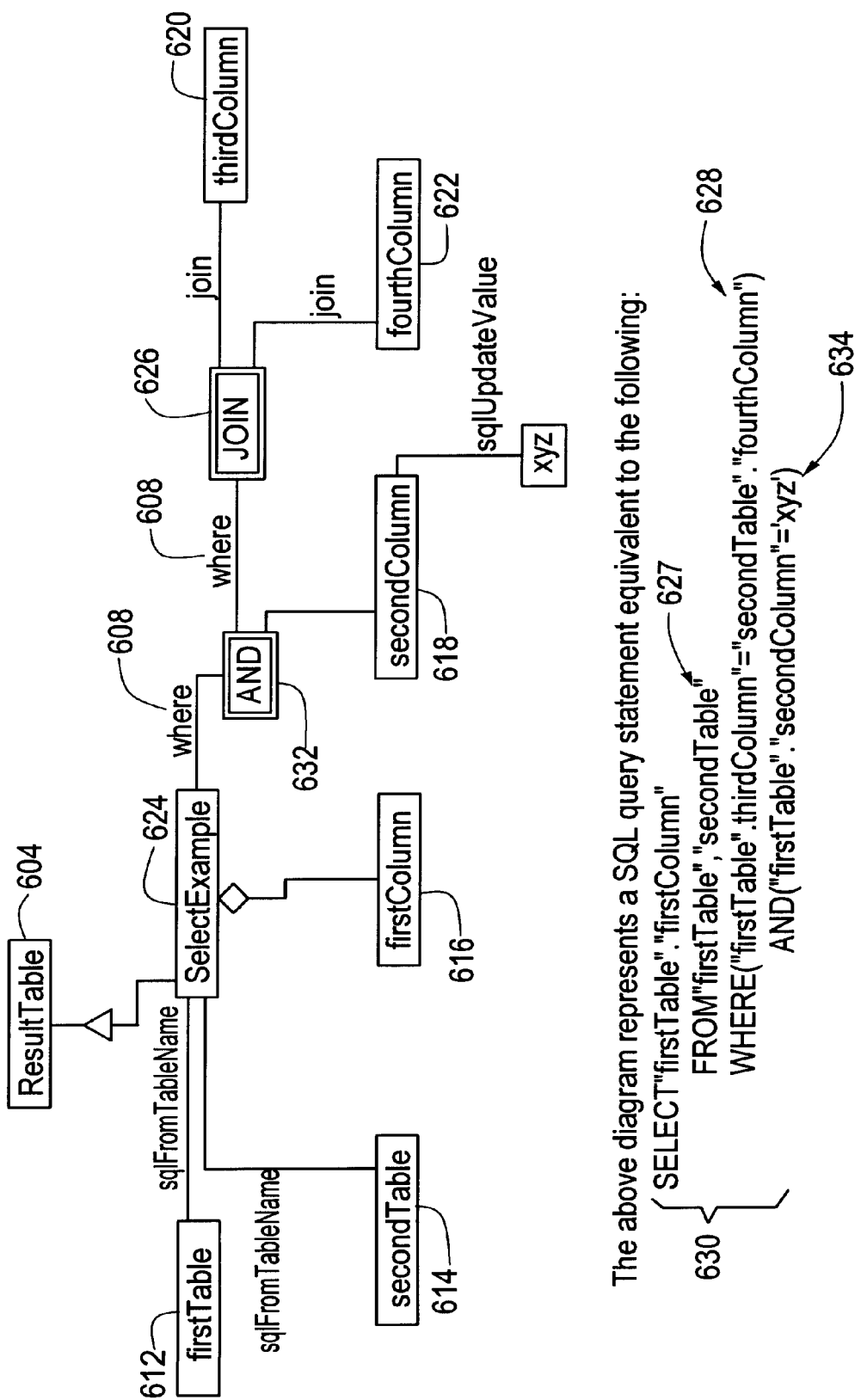
FIG. 71 illustrates generation of an SQL query from an object diagram.

Referring to FIGS. 70 and 71, interaction between the program and the database 26 (FIG. 1), which may be a relational database, can be controlled via special object diagrams. A plurality of predefined superclass objects designed for database interaction are supplied from the knowledgebase 452 (FIG. 55). The predefined superclasses include Database 600, Table 602, ResultTable 604, Column 606, ColumnDataType and Where 608. Database indicates a collections of tables. Table describes the structure of the database, and ResultTable is a subclass of table. Column indicates a column in a table with a given data type, and ColumnDataType indicates split data typing to do a relation line for object modeling. Where creates an object. These superclasses can be employed in an object diagram to create tables and generate queries.

FIG. 70 illustrates table generation. A database DB 610 is defined to be a database 600, and includes firstTable 612 and secondTable 614. FirstTable and secondTable are defined to be Tables 602. FirstColumn 616, secondColumn 618 and thirdColumn 620 are defined to be Columns 606, and are in firstTable 612. FourthColumn 622, which is also a column 606, is in secondTable 614. Each of the columns is indicated to be a forty character variable type 624. Hence, the SQL statements 626 are generated from the diagram. If no database were specified, a current or default database would be utilized. Otherwise, the SQL statements would be generated in anticipation that the database would be specified later.

FIG. 71 illustrates query generation. A SelectExample 624, which is a ResultTable 604, is associated with firstTable 612, including firstColumn 616, and secondTable 614. The SELECT portion of the SQL statement 630 is produced by the association of firstColumn 616 with SelectExample 624. An association "sqlFromTableName" used in conjunction with SelectExample 624 and both firstTable 612 and secondTable 614 is translated to line 627. A join 626 of fourthColumn 622 and thirdColumn 620 is translated to line 628 of SQL statement 630. An AND 632 associated with the join 626 and secondColumn 618 is translated to line 634.

Figure 72:
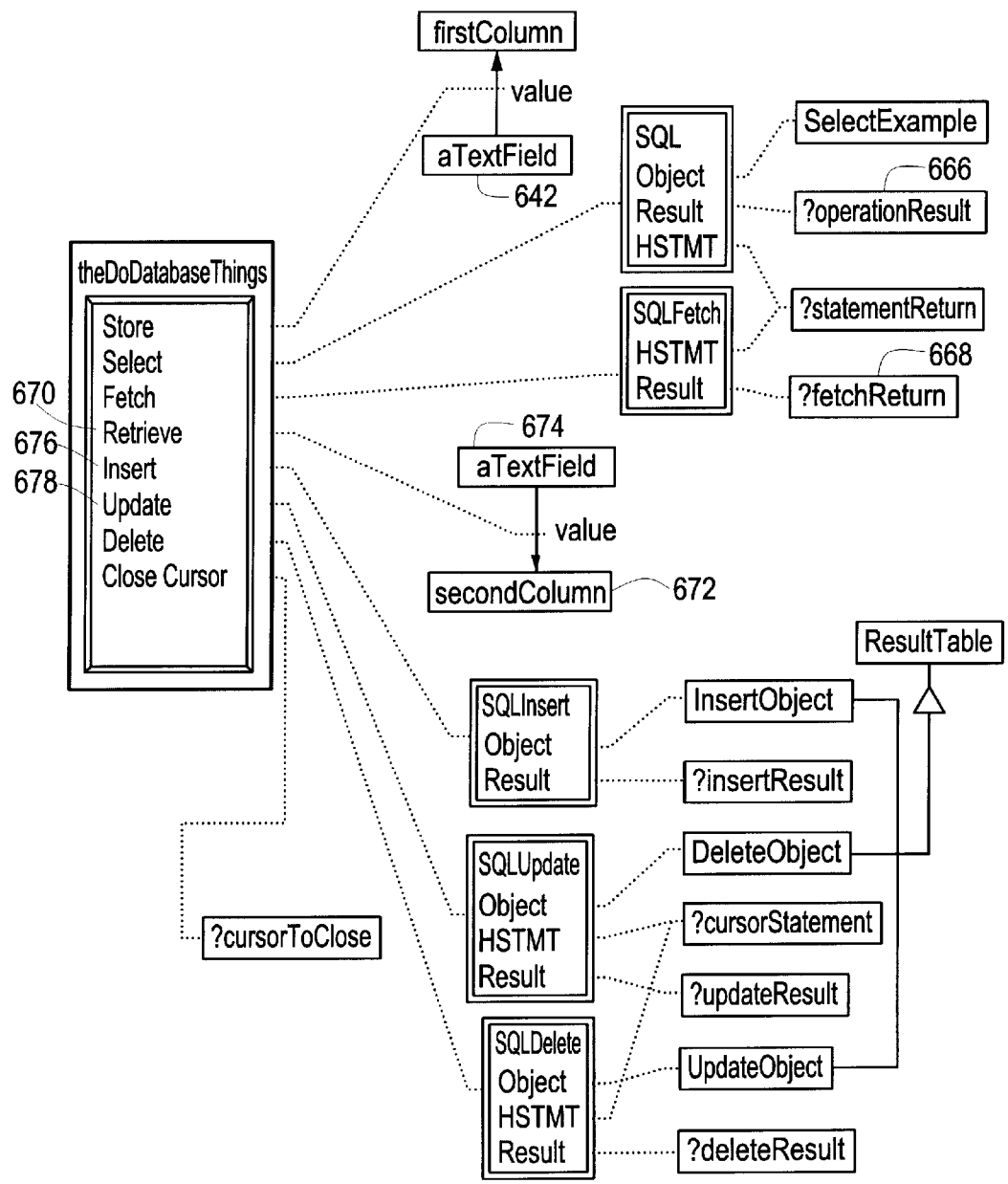
FIG. 72 illustrates database related rules for integration of database functions with the program.

FIG. 72 illustrates database-specific rules which are employed to link database functions to rule diagrams. Store 640 operates to put data inputted from a field into the database, e.g., to enter data inputted from a text field 642 into the database. Select 644 operates to bind columns and otherwise prepare for data retrieval. Fetch 646 takes a handle and produces a result. For example, Fetch 646 will return the result 666 produced by execution of the Select 644 rule as ?fetchReturn 668. For this reason, Select and Fetch are typically executed in sequence. Retrieve 670 operates to get a data value from the database and feed that value to a widget, e.g., from a column 672 to a field 674 to display data. Insert 676 and Update 678 operate following Fetch 646 to insert and delete the respectively indicated records.

Having described the preferred embodiments of the invention, it will now become apparent to one of skill in the art that other embodiments incorporating the presently disclosed techniques, apparatus and concepts may be used. Accordingly, the invention should not be viewed as limited to the disclosed embodiments, but rather should be viewed as limited only by the spirit and scope of the appended claims.

We claim:

1. A method for generating a software program in a predetermined language including the steps of:

graphically describing functionality for the program by generating at least one descriptive diagram, said at least one descriptive diagram including a rule diagram, said rule diagram including at least one rule, said rule including an object, a cause, and an effect, wherein said cause includes at least one condition, wherein said effect represents forming an instance of said object, wherein said effect further includes at least one expression, and wherein said at least one expression assigns a value to an attribute of said instance of said object;

employing the at least one descriptive diagram to generate an executable working model of the program by expressing the at least one descriptive diagram in an interpretable intermediate modeling language, wherein said working model is operable to evaluate said at least one expression to assign said value to said attribute of said instance of said object in the event that said condition is met, wherein said working model includes a plurality of special predicates containing type information regarding said object and said instance of said object, and wherein said working model is further operable to execute without checking said type information; and generating source code in the predetermined language from the working model, wherein said generated source code reflects said type information contained in said special predicates within said working model.

2. The method of claim 1 including the further step of automatically generating representative expressions in the intermediate modeling language in response to additive changes in the at least one descriptive diagram.

3. The method of claim 2 including the further step of automatically deleting intermediate modeling language expressions corresponding to deleted portions in the at least one descriptive diagram.

4. The method of claim 1 including the further step of generating object diagrams in which objects are linked by associations, the object diagrams defining relationships between objects.

5. The method of claim 4 including the further step of specifying type relations between objects only for generation of the source code in the predetermined language.

6. The method of claim 4 including the further step of establishing inheritance between objects based on the associations that link objects.

7. The method of claim 4 including the further step of generating at least one state diagram defining a plurality of states associated with at least one object in the object diagram and state sequences caused by inputted events, the states being interconnected by transitions.

8. The method of claim 7 including the further step of generating at least one event object diagram in which events that affect transitions in the state diagram are defined.

9. The method of claim 8 including the further step of generating at least one rule diagram for defining activity within the program, the at least one rule diagram comprising rules and being employed to extend object diagrams and state diagrams such that the program operates in the desired manner.

10. The method of claim 9 including defining at least one cause and at least one effect for each rule in the rule diagram.

11. The method of claim 10 including distinctive types of causes, each type associated with a respective distinct execution priority.

12. The method of claim 10 wherein the at least one cause is comprised of a set of cause alternatives, each cause alternative being associated with an association in at least one object diagram.

13. The method of claim 12 wherein each effect is a set of actions triggered by execution of a cause alternative.

14. The method of claim 13 including the further step of applying each rule action in sequential order at execution.

15. The method of claim 14 including the further step of considering a cause alternative successful if the corresponding effect succeeds to execute.

16. The method of claim 15 including the further step of binding the rule applicable to a given object at runtime, the applicable rule being the innermost rule in the hierarchy.

17. The method of claim 16 including the further step of associating each alternative in a cause with an effect, and binding each effect to one object.

18. The method of claim 17 including the further step of sequentially attempting execution of each associated rule action when an effect is executed.

19. The method of claim 18 including the further step of considering the cause that called an effect completed if all of the associated rule actions are completed.

20. The method of claim 19 including the further step of, when a rule action is not successful, terminating execution of the corresponding effect and attempting the next sequential alternative.

21. The method or claim 20 including the further step of performing the alternative sequentially and, if any of the alternative in the cause completes successfully, considering the associated rule completed.

22. The method of claim 21 including the further step of performing the rule actions sequentially.

23. The method of claim 22 including the further step of, when a cause is not successful, searching for a cause with a matching name bound to the superclass of the original object and executing the associated alternatives.

24. The method of claim 23 including the further step of creating a planned association when such association is established by a rule action.

25. The method of claim 10 including the further step of providing an iterator function that performs a cause on each object involved in a particular association.

26. The method of claim 9 including the further step of representing associations in the object modeling language as logical relationships that can be traversed in any direction.

27. The method of claim 9 including the further step of model in generalization and aggregation by associations.

28. The method of claim 9 including the further step of performing actions associated with the meaning of an object model including building additional objects and executing rules and expressions with an interpreter.

29. The method of claim 9 including the further step of adding new assertions, modifying the user interface, and accessing a database with a rule action interpreter.

30. The method of claim 9 including the further step of providing object inheritance, state inheritance and event inheritance in the object modeling language.

31. The method of claim 9 including the further step of preserving changes implemented directly in source code when diagrams are subsequently modified.

32. The method of claim 31 including the further step of defining a set of named text-substitution macros to create files.

33. The method of claim 32 including the further step of recreating the original file in a specified directory.

34. The method of claim 33 including the further step of comparing the old file and the new file with a diff routine.

35. The method of claim 34 including the further step of employing a line number range generated by the diff routine to determine which macro was used to generate any affected text in the source code.

36. The method of claim 35 including the further step of creating an override file associated with the data file.

37. The method of claim 36 including the further step of determining differences in macro execution and, upon reaching a macro execution that contains lines that were changed, outputting an add or change record as appropriate.

38. The method of claim 9 including the further step of generating object diagrams which define database interaction.

39. The method of claim 38 including the further step of generating SQL statements with the object diagram.

40. The method of claim 39 including the further step of generating tables with the object diagram.

41. The method of claim 40 including the further step of generating queries with the object diagram.

42. The method of claim 41 including the further step of employing database-specific rules to link database functions to rule diagrams.

43. The method of claim 1 including the further step of graphically describing user interface functionality for the program by generating at least one user interface object diagram.

44. The method of claim 43 including the further step of automatically generating a user interface corresponding to the at least one user interface diagram.

45. The method of claim 1 including the further step of linking first and second objects by a multiplicity association indicating that the second object can be "many" in the relationship defined by the association.

46. The method of claim 1 including the further step of linking first and second objects by a multiplicity association indicating that both the first and second objects can be "many" in the relationship defined by the association.

47. A development tool for generating a software program in a predetermined language, comprising:
an interface through which functionality for the program is graphically described in at least one descriptive diagram, said at least one descriptive diagram including a rule diagram, said rule diagram including at least one rule, said rule including an object, a cause, and an effect, wherein said cause includes at least one condition, wherein said effect represents forming an instance of said object, and wherein said effect further includes at least one expression, and wherein said at least one expression assigns a value to an attribute of said instance of said object;
a tool user interface that generates an executable working model of the program from the at least one diagram, the working model being represented in an interpretable intermediate modeling language, wherein said working model is operable to evaluate said at least one expression to assign said value to said attribute of said instance of said object in the event that said condition is met, wherein said working model includes a plurality of special predicates containing type information regarding said object and said instance of said object, and wherein said working model is further operable to execute without checking said type information; and
a source code generator that provides source code in the predetermined language from the intermediate modeling language representation of the program, wherein said generated source code reflects said type information contained in said special predicates within said working model.

48. The tool of claim 47 further including an engine that automatically generates representative expressions in the intermediate modeling language in response to additive changes in the at least one descriptive diagram.

49. The tool of claim 48 wherein the engine automatically deletes intermediate modeling language expressions corresponding to deleted portions in the at least one descriptive diagram.

50. The tool of claim 47 further including an interface through which object diagrams in which objects are linked by associations are generated, the object diagrams defining relationships between objects.

51. The tool of claim 50 wherein type relations between objects are specified only for generation of the source code in the predetermined language.

52. The tool of claim 50 wherein inheritance is established between objects based on the associations that link objects.

53. The tool of claim 50 further including an engine through which at least one state diagram defining a plurality of states associated with at least one object in the object diagram and state sequences caused by inputted events is generated, the states being interconnected by transitions.

54. The tool of claim 53 wherein at least one event object diagram in which events that affect transitions in the state diagram are defined is generated.

55. The tool of claim 54 including an engine through which at least one rule diagram for defining activity within the program, the at least one rule diagram comprising rules and being employed to extend object diagrams and state diagrams such that the program operates in the desired manner is generated.

56. The tool of claim 55 wherein at least one cause and at least one effect are defined for each rule in the rule diagram.

57. The tool of claim 56 further including distinctive types of causes, each type associated with a respective distinct execution priority.

58. The tool of claim 56 wherein the at least one cause is comprised of a set of cause alternatives, each cause alternative being associated with an association in at least one object diagram.

59. The tool of claim 58 wherein each effect is a set of actions triggered by execution of a cause alternative.

60. The tool of claim 59 wherein each rule action is applied in sequential order at execution.

61. The tool of claim 60 wherein a cause alternative is deemed successful if the corresponding effect succeeds to execute.

62. The tool of claim 61 wherein the rule applicable to a given object is bound at runtime, the applicable rule being the innermost rule in the hierarchy.

63. The tool of claim 62 wherein each alternative in a cause is associated with an effect, and each effect is bound to one object.

64. The tool of claim 63 wherein execution of each associated rule action is sequentially attempted when an effect is executed.

65. The tool of claim 64 wherein the cause that called an effect is deemed completed if all of the associated rule actions are completed.

66. The tool of claim 65 wherein, when a rule action is not successful, execution of the corresponding effect is terminated and the next sequential alternative is attempted.

67. The tool of claim 66 wherein the alternative is performed sequentially and, if any of the alternative in the cause completes successfully, the associated rule is deemed completed.

68. The tool of claim 67 wherein the rule actions are performed sequentially.

69. The tool of claim 68 wherein, when a cause is not successful, a search is executed for a cause with a matching name bound to the superclass of the original object and the associated alternatives are executed.

70. The tool of claim 69 further including a planned association that is created when such association is established by a rule action.

71. The tool of claim 56 further including an iterator function that performs a cause on each object involved in a particular association.

72. The tool of claim 55 wherein associations are represented in the object modeling language as logical relationships that can be traversed in any direction.

73. The tool of claim 55 wherein generalization and aggregation are modeled by associations.

74. The tool of claim 55 wherein actions associated with the meaning of an object model including building additional objects and executing rules and expressions are performed with an interpreter.

75. The tool of claim 55 further including a rule action interpreter for adding new assertions, modifying the user interface, and accessing a database.

76. The tool of claim 55 wherein object inheritance, state inheritance and event inheritance are provided in the object modeling language.

77. The tool of claim 55 wherein changes implemented directly in source code are preserved when diagrams are subsequently modified.

78. The tool of claim 77 wherein a set of named text-substitution macros is defined to create files.

79. The tool of claim 78 wherein the original file in a specified directory is recreated.

80. The tool of claim 79 wherein the old file and the new file are compared with a diff routine.

81. The tool of claim 80 wherein a line number range generated by the diff routine is employed to determine which macro was used to generate any affected text in the source code.

82. The tool of claim 81 wherein an override file associated with the data file is created.

83. The tool of claim 82 wherein differences in macro execution are determined and, upon reaching a macro execution that contains lines that were changed, an add or change record is output as appropriate.

84. The tool of claim 55 further including an engine for generation of object diagrams which define database interaction.

85. The tool of claim 84 further including an engine for generating SQL statements from the object diagram.

86. The tool of claim 85 further including an engine for generating tables from the object diagram.

87. The tool of claim 86 further including an engine for generating queries from the object diagram.

88. The tool of claim 87 wherein database-specific rules are employed to link database functions to rule diagrams.

89. The tool of claim 47 further including an engine through which user interface functionality for the program is specified in at least one user interface object diagram.

90. The tool of claim 89 further including an interpreter which automatically generates a user interface corresponding to the at least one user interface diagram.

91. The tool of claim 47 further including a multiplicity association for linking first and second objects in a manner indicating that the second object can be "many" in the relationship defined by the association.

92. The tool of claim 47 further including a multiplicity association for linking first and second objects in a manner indicating that both the first and second objects can be "many" in the relationship defined by the association.

* * * * *